(12) United States Patent
Kutsunai et al.

(10) Patent No.: US 6,737,697 B2
(45) Date of Patent: May 18, 2004

(54) SEMICONDUCTOR DEVICE AND METHOD AND SYSTEM FOR FABRICATING THE SAME

(75) Inventors: Toshie Kutsunai, Kusatsu (JP); Shinichiro Hayashi, Takatsuki (JP); Yuji Judai, Uji (JP); Yoshihisa Nagano, Suita (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/779,662

(22) Filed: Feb. 9, 2001

(65) Prior Publication Data

US 2001/0028074 A1 Oct. 11, 2001

(30) Foreign Application Priority Data

Apr. 11, 2000 (JP) ........................ 2000-109168
Nov. 6, 2000 (JP) ........................ 2000-337592

(51) Int. Cl.$^7$ .................. H01L 29/76; H01L 29/94; H01L 31/062; H01L 27/108
(52) U.S. Cl. ................... 257/306; 257/295; 438/3
(58) Field of Search ................. 257/295, 306; 438/3

(56) References Cited

U.S. PATENT DOCUMENTS

| | | | | |
|---|---|---|---|---|
| 5,960,252 A | * | 9/1999 | Matsuki et al. | 438/3 |
| 6,051,858 A | * | 4/2000 | Uchida et al. | 257/295 |
| 6,174,822 B1 | * | 1/2001 | Nagano et al. | 438/763 |
| 6,201,271 B1 | * | 3/2001 | Okutoh et al. | 257/295 |
| 6,225,185 B1 | * | 5/2001 | Yamazaki et al. | 438/396 |
| 6,274,424 B1 | * | 8/2001 | White et al. | 438/239 |
| 6,376,327 B2 | * | 4/2002 | Sandhu et al. | 438/396 |

FOREIGN PATENT DOCUMENTS

| | | |
|---|---|---|
| JP | 05-259155 | 10/1993 |
| JP | 06-326087 | 11/1994 |
| JP | 07-050391 | 2/1995 |
| JP | 08-274174 | 10/1996 |
| JP | 09-074090 | 3/1997 |
| JP | 10-144681 | 9/1998 |
| JP | 10-270556 | 10/1998 |
| JP | 11-008360 | 1/1999 |
| JP | 11-054713 | 2/1999 |
| JP | 11-074486 | 3/1999 |
| JP | 11-126876 | 5/1999 |
| JP | 11-126883 | 5/1999 |
| JP | 2000-049227 | 2/2000 |

* cited by examiner

*Primary Examiner*—George Eckert
*Assistant Examiner*—Joseph Nguyen
(74) *Attorney, Agent, or Firm*—Nixon Peabody, LLP

(57) ABSTRACT

A capacitor including a capacitor lower electrode, a capacitor dielectric film of a highly dielectric film or a ferroelectric film and a capacitor upper electrode is formed on a semiconductor substrate. A protection film is formed on the semiconductor substrate so as to cover the capacitor. A first TEOS film having a relatively large water content is formed on the protection film through first TEOS-$O_3$ CVD where an ozone concentration is relatively low. A second TEOS-$O_3$ film having a relatively small water content is formed on the first TEOS-$O_3$ film through second TEOS-$O_3$ CVD where the ozone concentration is relatively high.

4 Claims, 12 Drawing Sheets

SEMICONDUCTOR DEVICE AND METHOD AND SYSTEM FOR FABRICATING THE SAME

BACKGROUND OF THE INVENTION

The present invention relates to a semiconductor device equipped with a capacitor including a capacitor dielectric film made from a dielectric film with a large dielectric constant (hereinafter referred to as a highly dielectric film) or a ferroelectric film, and method and system for fabricating the same.

In accordance with recent trend toward a high operation speed and small power consumption of microcomputers and the like, consumer electronic equipment are highly developed, and semiconductor elements included in semiconductor devices used in the consumer electronic equipment have been rapidly refined.

As a result, unwanted radiation, that is, electromagnetic wave noise caused in electronic equipment, has become a serious problem. As means for reducing the unwanted radiation, attention is paid to a technique to involve, in a semiconductor integrated circuit device, a capacitor having large capacity and including a capacitor dielectric film of a highly dielectric film or a ferroelectric film.

Furthermore, in accordance with development of higher integration of a dynamic RAM, a technique to use a highly dielectric film or a ferroelectric film as a capacitor dielectric film of a capacitor instead of a conventionally used oxide or nitride of silicon is now widely studied.

Moreover, for the purpose of realizing practical use of a nonvolatile RAM capable of operating at a low voltage and reading or writing at a high speed, a ferroelectric film with a spontaneous polarization characteristic is now earnestly studied and developed.

Accordingly, it is significant to develop a method for realizing higher integration of a semiconductor device without degrading characteristics of a capacitor.

Now, a conventional method of fabricating a semiconductor device will be described with reference to FIGS. 11A through 11C, 12A and 12B.

First, as is shown in FIG. 11A, after forming an isolation region 11 and a gate electrode 12 of an FET on a semiconductor substrate 10, impurity diffusion layers and the like (not shown) of the FET are formed in a surface portion of the semiconductor substrate 10, and an insulating film 13 is deposited to cover the isolation region 11 and the gate electrode 12. Thereafter, on a portion of the insulating film 13 above the isolation region 11, a capacitor lower electrode 14 of a platinum film or the like, a capacitor dielectric film 15 of a highly dielectric film or a ferroelectric film and a capacitor upper electrode 16 of a platinum film or the like are formed. The capacitor lower electrode 14, the capacitor dielectric film 15 and the capacitor upper electrode 16 together form a capacitor.

Next, as is shown in FIG. 11B, after forming a first protection film 17 for covering the capacitor, a contact hole 18 of the FET is formed in the insulating film 13 and a contact hole 19 of the capacitor is formed in the first protection film 17. Then, a metal film such as a titanium film and an aluminum alloy film is deposited over the insulating film 13 and the first protection film 17, and the metal film is patterned into a first interconnection layer 20 connected to the impurity diffusion layer of the FET or the capacitor upper electrode 16. Thereafter, the first interconnection layer 20 is subjected to a heat treatment.

Then, as is shown in FIG. 11C, by plasma tetraethylorthosilicate (hereinafter referred to as TEOS) CVD, an interlayer insulating film (plasma TEOS film) 21 of a silicon oxide film is deposited over the first interconnection layer 20 and the capacitor. In consideration of planarization by reflow, the interlayer insulating film 21 is formed so as to have a thickness of approximately 1 µm or more in a portion above the first interconnection layer 20 on the capacitor upper electrode 16.

Next, after planarizing the interlayer insulating film 21, a contact hole is formed in the interlayer insulating film 21, and a second interconnection layer 22 connected to the first interconnection layer 20 is formed on the interlayer insulating film 21 as is shown in FIG. 12A.

Then, as is shown in FIG. 12B, a second protection film 23 is deposited on the interlayer insulating film 21 so as to cover the second interconnection layer 22.

However, since the interlayer insulating film 21 is formed from the plasma TEOS film in the conventional structure, the interlayer insulating film 21 applies merely small stress to the capacitor and tends to be compressive. Accordingly, there arises a problem that the capacitor dielectric film 15 cannot sufficiently attain spontaneous planarization, and hence, the capacitor cannot attain good characteristics.

Therefore, the present inventors have proposed, in Japanese Patent Publication No. 2846310, a technique to use, instead of the plasma TEOS film, a silicon oxide film formed by $TEOS-O_3$ CVD (hereinafter referred to as the $TEOS-O_3$ film) as the interlayer insulating film 21.

When the $TEOS-O_3$ film is used as the interlayer insulating film 21, stress applied to the capacitor can be increased, so as to improve the characteristics of the capacitor.

The use of the $TEOS-O_3$ film as the interlayer insulating film, however, causes other problems as follows: Defects such as holes are locally formed in the interlayer insulating film of the $TEOS-O_3$ film; and the growth rate of the $TEOS-O_3$ film is varied depending upon the kind of underlying film.

Such problems lead to quality degradation of a semiconductor integrated circuit device, and in addition, the characteristics of the capacitor cannot be improved because stress cannot be uniformly applied to the capacitor.

SUMMARY OF THE INVENTION

In consideration of the aforementioned problems, an object of the invention is improving the characteristics of a $TEOS-O_3$ film formed on a capacitor.

In order to achieve the object, the first semiconductor device of this invention comprises a capacitor including a capacitor lower electrode, a capacitor dielectric film of a highly dielectric film or a ferroelectric film and a capacitor upper electrode successively formed on a semiconductor substrate; a protection film formed on the semiconductor substrate over the capacitor; a first $TEOS-O_3$ film having a relatively large water content formed on the protection film through first $TEOS-O_3$ CVD where an ozone concentration is relatively low; and a second $TEOS-O_3$ CVD film having a relatively small water content formed on the first $TEOS-O_3$ film through second $TEOS-O_3$ CVD where the ozone concentration is relatively high.

In the first semiconductor device, the first $TEOS-O_3$ film formed on the protection film covering the capacitor is formed through the first $TEOS-O_3$ CVD where the ozone concentration is relatively low. Therefore, the first $TEOS-O_3$ film can attain good film quality with no defects such as holes and can be improved in its adhesion to the protection film due to its large water content. Also, since the second TEOS-$O_3$ film is formed through the second TEOS-$O_3$ CVD where the ozone concentration is relatively high, it can apply large stress to the capacitor dielectric film of the capacitor due to its small water content. Accordingly, the spontaneous polarization characteristic of the capacitor dielectric film can be improved, resulting in improving the characteristics of the capacitor. As a result, a semiconductor device including a highly reliable capacitor can be realized.

The first semiconductor device preferably further comprises a hydrophobic primer layer formed on a surface of the protection film.

Thus, the first TEOS-$O_3$ film is formed on the protection film having a hydrophobic surface and hence can be satisfactorily grown to attain good step coverage. Accordingly, the step coverage of an interlayer insulating film formed on the capacitor can be improved, so as to improve the insulating property and the surface planeness of the interlayer insulating film.

The first semiconductor device preferably further comprises an underlying oxide film formed, between the protection film and the first TEOS-$O_3$ film, from a silicon oxide film including no impurity or a silicon oxide film including at least one of boron and phosphorus.

Thus, the first TEOS-$O_3$ film is formed on the underlying oxide film having no dependency on an underlying film and good conformability with a TEOS-$O_3$ film. Therefore, even when underlying films of different materials, such as an interconnection layer and a protection film, are present below the first TEOS-$O_3$ film, the first TEOS-$O_3$ film can be satisfactorily grown without being affected by these underlying films, resulting in attaining a uniform thickness.

When the first semiconductor device includes the underlying oxide film, it preferably further comprises a hydrophobic primer layer formed on a surface of the underlying oxide film.

Thus, the first TEOS-$O_3$ film is formed on the underlying oxide film having a hydrophobic surface, and hence, it can be satisfactorily grown to attain good step coverage. Accordingly, the step coverage of an interlayer insulating film formed on the capacitor can be improved, so as to improve the insulating property and the surface planeness of the interlayer insulating film.

The second semiconductor device of this invention comprises a capacitor including a capacitor lower electrode, a capacitor dielectric film of a highly dielectric film or a ferroelectric film and a capacitor upper electrode successively formed on a semiconductor substrate; a protection film formed on the semiconductor substrate over the capacitor; an underlying oxide film formed, on the protection film, from a silicon oxide film including no impurity or a silicon oxide film including at least one of boron and phosphorus; and a TEOS-$O_3$ film formed on the underlying oxide film.

In the second semiconductor device, the TEOS-$O_3$ film is formed on the underlying oxide film having no dependency on an underlying film and good conformability with a TEOS-$O_3$ film. Therefore, even when underlying films of different materials, such as an interconnection layer and a protection film, are present below the TEOS-$O_3$ film, it can be satisfactorily grown without being affected by these underlying films. As a result, an interlayer insulating film can be formed in a uniform thickness. Accordingly, a semiconductor device including a stable and long-lived capacitor can be realized.

The second semiconductor device preferably further comprises a hydrophobic primer layer formed on a surface of the underlying oxide film.

Thus, the TEOS-$O_3$ film is formed on the underlying oxide film with a hydrophobic surface, and hence, it can be satisfactorily grown to attain good step coverage. Accordingly, the step coverage of an interlayer insulating film formed on the capacitor can be improved, so as to improve the insulating property and the surface planeness of the interlayer insulating film.

The first method of fabricating a semiconductor device of this invention comprises the steps of forming, on a semiconductor substrate, a capacitor including a capacitor lower electrode, a capacitor dielectric film of a highly dielectric film or a ferroelectric film and a capacitor upper electrode; forming, on the semiconductor substrate, a protection film over the capacitor; forming, on the protection film, a first TEOS-$O_3$ film through first TEOS-$O_3$ CVD where an ozone concentration is relatively low; and forming, on the first TEOS-$O_3$ film, a second TEOS-$O_3$ film through second TEOS-$O_3$ CVD where the ozone concentration is relatively high.

In the first method of fabricating a semiconductor device, the first TEOS-$O_3$ film is formed on the protection film covering the capacitor through the first TEOS-$O_3$ CVD where the ozone concentration is relatively low. Therefore, the first TEOS-$O_3$ film can attain good film quality with no defects such as holes and good adhesion to the protection film due to its large water content. Also, since the second TEOS-$O_3$ film is formed through the second TEOS-$O_3$ CVD where the ozone concentration is relatively high, it can apply large stress to the capacitor dielectric film of the capacitor due to its small water content. Accordingly, the spontaneous polarization characteristic of the capacitor dielectric film can be improved, so as to improve the characteristics of the capacitor. As a result, a semiconductor device including a highly reliable capacitor can be fabricated.

The first method of fabricating a semiconductor device preferably further comprises, between the step of forming the protection film and the step of forming the first TEOS-$O_3$ film, a step of forming a hydrophobic primer layer on a surface of the protection film by supplying a hydrophobic primer agent onto the protection film.

Thus, the first TEOS-$O_3$ film is formed on the protection film having a hydrophobic surface, and hence, it can be satisfactorily grown to attain good step coverage. Accordingly, the step coverage of an interlayer insulating film formed on the capacitor can be improved, so as to improve the insulating property and the surface planeness of the interlayer insulating film.

The first method of fabricating a semiconductor device preferably further comprises, between the step of forming the protection film and the step of forming the first TEOS-$O_3$ film, a step of forming, on the protection film, an underlying oxide film from a silicon oxide film including no impurity or a silicon oxide film including at least one of boron and phosphorus.

Thus, the first TEOS-$O_3$ film is formed on the underlying oxide film having no dependency on underlying films and good conformability with a TEOS-$O_3$ film. Therefore, even when underlying films of different materials, such as an interconnection layer and a protection film, are present below the first TEOS-$O_3$ film, it can be satisfactorily grown without being affected by these underlying films, resulting in attaining a uniform thickness.

When the first method of fabricating a semiconductor device includes the step of forming the underlying oxide film, it preferably further comprises, between the step of forming the underlying oxide film and the step of forming the first TEOS-$O_3$ film, a step of forming a hydrophobic primer layer on a surface of the underlying oxide film by supplying a hydrophobic primer agent onto the underlying oxide film.

Thus, the first TEOS-$O_3$ film is formed on the underlying oxide film having a hydrophobic surface, and hence, it can be satisfactorily grown to attain good step coverage. Accordingly, the step coverage of an interlayer insulating film formed on the capacitor can be improved, so as to improve the insulating property and the surface planeness of the interlayer insulating film.

In the first method of fabricating a semiconductor device, the ozone concentration in the first TEOS-$O_3$ CVD is preferably 25 g/m$^3$ or less and the ozone concentration in the second TEOS-$O_3$ CVD is preferably 130 g/m$^3$ or more.

In this manner, the first TEOS-$O_3$ film formed through the first TEOS-$O_3$ CVD can attain a good self-reflow characteristic, and hence can be free from imperfections such as defects. Accordingly, the first TEOS-$O_3$ film can attain good film quality. Also, the second TEOS-$O_3$ film formed through the second TEOS-$O_3$ CVD can apply sufficient stress to the capacitor dielectric film of the capacitor and prevent cracks derived from its small water content from being caused therein during a heat treatment.

In the first method of fabricating a semiconductor device, the first TEOS-$O_3$ CVD is preferably carried out with a value of (a flow rate of ozone/a flow rate of TEOS) set to 3 or less, and the second TEOS-$O_3$ CVD is preferably carried out with the value of (a flow rate of ozone/a flow rate of TEOS) set to 15 or more.

In this manner, the first TEOS-$O_3$ film formed through the first TEOS-$O_3$ CVD can attain a good self-reflow characteristic, and hence can be free from imperfections such as defects. Accordingly, the first TEOS-$O_3$ film can attain good film quality. Also, the second TEOS-$O_3$ film formed through the second TEOS-$O_3$ CVD can apply sufficient stress to the capacitor dielectric film of the capacitor and prevent cracks derived from its small water content from being caused therein during a heat treatment.

In the first method of fabricating a semiconductor device, the second TEOS-$O_3$ film preferably has tensile stress of $1 \times 10^2$ N/cm$^2$ through $4 \times 10^4$ N/cm$^2$.

Thus, the second TEOS-$O_3$ film can apply sufficient stress to the capacitor dielectric film of the capacitor, so as to improve the spontaneous polarization characteristic of the capacitor dielectric film. As a result, the characteristics of the capacitor can be improved.

In the first method of fabricating a semiconductor device, the second TEOS-$O_3$ CVD is preferably carried out at a temperature of 350° C. through 450° C.

Thus, the second TEOS-$O_3$ film can be subjected to a heat treatment carried out at a high temperature. Therefore, the stress of the second TEOS-$O_3$ film can be increased and the density of the second TEOS-$O_3$ film can be increased through the heat treatment carried out at a high temperature. As a result, the characteristics of the capacitor can be further improved.

The first method of fabricating a semiconductor device preferably further comprises a step of conducting a plasma treatment on a surface of the second TEOS-$O_3$ film.

Thus, a hardening layer with a thickness of approximately several nm can be formed on a surface of the second TEOS-$O_3$ film, so as to improve the ability to disperse the water content of the second TEOS-$O_3$ film.

In this case, the plasma treatment is preferably plasma coating or plasma sputtering etching using plasma of a gas including at least one of a $N_2$ gas, a $NH_3$ gas, a $N_2O$ gas, an $O_2$ gas, an Ar gas, a $Cl_2$ gas and a $C_2F_6$ gas.

Thus, a hardening layer with a thickness of approximately several nm can be definitely formed on a surface of the second TEOS-$O_3$ film.

The first method of fabricating a semiconductor device preferably further comprises a step of forming a silicon nitride layer on a surface of the second TEOS-$O_3$ film by conducting a plasma treatment on the second TEOS-$O_3$ film.

Thus, the water content of the second TEOS-$O_3$ film can be prevented from diffusing into the capacitor dielectric film and the water content in the air can be prevented from diffusing into the second TEOS-$O_3$ film because the silicon nitride film has high ability to prevent diffusion of water content.

The second method of fabricating a semiconductor device of this invention comprises the steps of forming, on a semiconductor substrate, a capacitor including a capacitor lower electrode, a capacitor dielectric film of a highly dielectric film or a ferroelectric film and a capacitor upper electrode; forming a protection film on the semiconductor substrate over the capacitor; forming, on the protection film, an underlying oxide film from a silicon oxide film including no impurity or a silicon oxide film including at least one of boron and phosphorus; and forming a TEOS-$O_3$ film on the underlying oxide film.

In the second method of fabricating a semiconductor device, the TEOS-$O_3$ film is formed on the underlying oxide film having no dependency on underlying films and good conformability with a TEOS-$O_3$ film. Therefore, even when underlying films of different materials, such as an interconnection layer and a protection film, are present below the TEOS-$O_3$ film, it can be satisfactorily grown without being affected by the underlying films. As a result, an interlayer insulating film can be formed in a uniform thickness. Accordingly, a semiconductor device including a stable and long-lived capacitor can be fabricated.

In the second method of fabricating a semiconductor device, the protection film is preferably a silicon oxide film including no impurity or a silicon oxide film including at least one of boron and phosphorus formed by TEOS-$O_3$ CVD.

Thus, the protection film can attain tensile stress, and hence, the spontaneous polarization of the capacitor dielectric film of the capacitor formed on the protection film can be further accelerated and the surface planeness of the protection film can be improved. Accordingly, the capacitor can attain stability and a long life.

The second method of fabricating a semiconductor device preferably further comprises, between the step of forming the underlying oxide film and the step of forming the TEOS-$O_3$ film, a step of forming a hydrophobic primer layer on a surface of the underlying oxide film by supplying a hydrophobic primer agent onto the underlying oxide film.

Thus, the TEOS-$O_3$ film is formed on the underlying oxide film having a hydrophobic surface, and hence, it can be satisfactorily grown to attain good step coverage. Accordingly, the step coverage of an interlayer insulating film formed on the capacitor can be improved, so as to improve the insulating property and the surface planeness of the interlayer insulating film.

When the first or second method of fabricating a semiconductor device includes the step of forming the hydrophobic primer layer, the primer agent is preferably hexamethyldisilazane.

Thus, the surface of the protection film or the underlying oxide film can be definitely made hydrophobic.

In the second method of fabricating a semiconductor device, the TEOS-$O_3$ film is preferably formed through TEOS-$O_3$ CVD where an ozone concentration is 130 g/m$^3$ or more.

Thus, the TEOS-$O_3$ film can attain a good self-reflow characteristics, so as to be free from imperfections such as defects. Therefore, the TEOS-$O_3$ film can attain good film quality.

In the second method of fabricating a semiconductor device, the TEOS-$O_3$ film is preferably formed through TEOS-$O_3$ CVD where a value of (a flow rate of ozone/a flow rate of TEOS) is set to 15 or more.

Thus, the TEOS-$O_3$ film can apply sufficient stress to the capacitor dielectric film of the capacitor and can prevent cracks derived from its small water content from being caused therein during a heat treatment.

The second method of fabricating a semiconductor device preferably further comprises a step of conducting a plasma treatment on a surface of the TEOS-$O_3$ film.

Thus, a hardening layer with a thickness of approximately several nm is formed on a surface of the TEOS-$O_3$ film, so as to improve the ability to prevent diffusion of the water content of the TEOS-$O_3$ film.

In this case, the plasma treatment is preferably plasma coating or plasma sputtering etching using plasma of a gas including at least one of a $N_2$ gas, a $NH_3$ gas, a $N_2O$ gas, an $O_2$ gas, an Ar gas, a $Cl_2$ gas and a $C_2F_6$ gas.

Thus, a hardening layer with a thickness of approximately several nm can be definitely formed on a surface of the TEOS-$O_3$ film.

The second method of fabricating a semiconductor device preferably further comprises a step of forming a silicon nitride layer on a surface of the TEOS-$O_3$ film by conducting a plasma treatment on the TEOS-$O_3$ film.

Thus, the water content of the TEOS-$O_3$ film can be prevented from diffusing into the capacitor dielectric film and the water content in the air can be prevented from diffusing into the TEOS-$O_3$ film because the silicon nitride film has high ability to prevent diffusion of the water content.

The system for fabricating a semiconductor device of this invention comprises a chamber including a substrate holder for holding a semiconductor substrate; TEOS-$O_3$ supply means for supplying, to the inside of the chamber, a mixture of gaseous TEOS and an ozone gas; and primer agent supply means for supplying, to the inside of the chamber, a hydrophobic gaseous primer agent.

The system for fabricating a semiconductor device of this invention thus includes the primer agent supply means for supplying the hydrophobic gaseous primer agent to the inside of the chamber. Therefore, a hydrophobic primer layer can be formed on a surface of an underlying film, such as a protection film or an underlying oxide film, formed below a TEOS-$O_3$ film. Accordingly, a TEOS-$O_3$ film with good step coverage can be grown.

In the system for fabricating a semiconductor device, the primer agent is preferably hexamethyldisilazane.

Thus, the surface of the underlying film such as a protection film or an underlying oxide film can be definitely made hydrophobic.

The system for fabricating a semiconductor device preferably further comprises means for supplying, to the inside of the chamber, a mixture obtained by mixing the mixture supplied from the TEOS-$O_3$ supply means with the primer agent supplied from the primer agent supply means.

Thus, after forming a hydrophobic primer layer on a surface of the underlying film such as a protection film or an underlying oxide film, a TEOS-$O_3$ film can be grown on the primer layer. Therefore, a TEOS-$O_3$ film with good step coverage can be formed with high mass-productivity.

In the system for fabricating a semiconductor device, the TEOS-$O_3$ supply means preferably has means for changing the gaseous TEOS into mist and mixing the mist with the ozone gas.

Thus, even when the ozone concentration in TEOS-$O_3$ CVD is low, a TEOS-$O_3$ film can be grown. Therefore, a TEOS-$O_3$ film having good film quality free from defects such as holes and having a large water content can be formed.

In the system for fabricating a semiconductor device, the TEOS-$O_3$ supply means preferably has means for charging the mist obtained from the gaseous TEOS with electricity.

Thus, the mist obtained from the TEOS can be charged with electricity, and hence, the growth rate of the TEOS-$O_3$ film can be improved and the thickness of the TEOS-$O_3$ film can be increased.

In this case, the substrate holder preferably has means for applying, to the semiconductor substrate, a polarity reverse to a polarity of electricity with which the mist is charged.

Thus, the charged TEOS mist can be electrostatically adsorbed onto the surface of the semiconductor substrate, and hence, the growth rate and the thickness of the TEOS-$O_3$ film can be further increased.

DETAILED DESCRIPTION OF THE INVENTION

Embodiment 1

A semiconductor device and a method of fabricating the same according to Embodiment 1 will now be described with reference to FIGS. 1A through 1C, 2A and 2B.

Figure 1A:
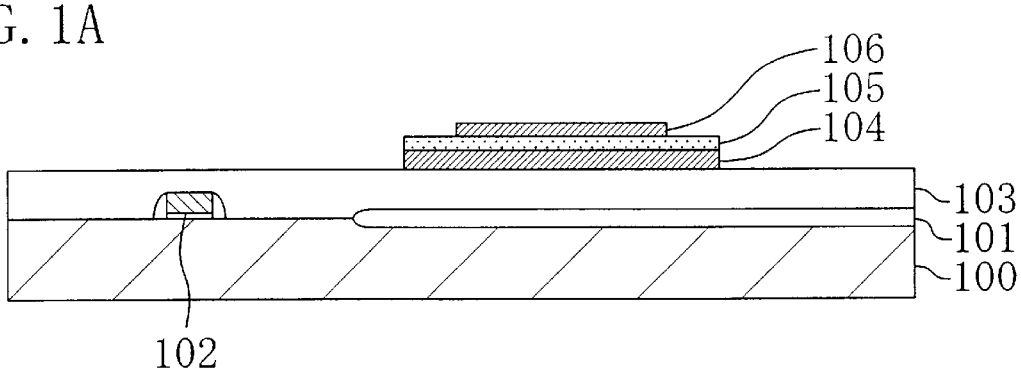
FIGS. 1A, 1B and 1C are cross-sectional views for showing procedures in a method of fabricating a semiconductor device according to Embodiment 1 of the invention.

First, as is shown in FIG. 1A, after forming an isolation region 101 and a gate electrode 102 of an FET on a semiconductor substrate 100, impurity diffusion layers and the like (not shown) of the FET are formed in a surface portion of the semiconductor substrate 100. Thereafter, an insulating film 103 is deposited over the isolation region 101 and the gate electrode 102.

Next, on a portion of the insulating film 103 above the isolation region 102, a capacitor lower electrode 104, a capacitor dielectric film 105 of a highly dielectric film or a ferroelectric film and a capacitor upper electrode 106 are formed. The capacitor lower electrode 104, the capacitor dielectric film 105 and the capacitor upper electrode 106 together form a capacitor.

Each of the capacitor lower electrode 104 and the capacitor upper electrode 106 can be formed by depositing, by sputtering, a metal film formed from a single layer of platinum, indium, palladium, ruthenium or alloy of two or more of these metals or a multi-layer film including two or more of a platinum film, an indium film, a palladium film and a ruthenium film, and patterning the metal film.

Also, the capacitor dielectric film 105 can be formed from a highly dielectric film or a ferroelectric film including strontium, bismuth or tantalum as a main component.

Figure 1B:
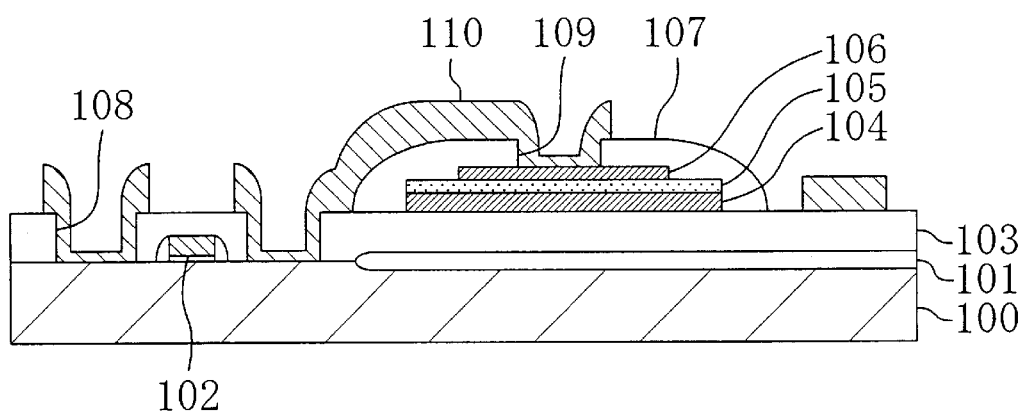

Next, as is shown in FIG. 1B, a first protection film 107 of a silicon oxide film is deposited by TEOS-$O_3$ CVD so as to cover the capacitor. The first protection film 107 can be formed from, for example, a silicon oxide film including no impurity, a silicon oxide film including boron and phosphorus, a silicon oxide film including phosphorus or a silicon oxide film including boron. When the first protection film 107 is thus formed by the TEOS-$O_3$ CVD, not only the first protection film 107 can be improved in its surface planeness but also the capacitor can be stabilized and become long-lived.

Then, after forming a contact hole 108 of the FET in the insulating film 103 and a contact hole 109 of the capacitor in the first protection film 107, a metal film of a multi-layer film including a titanium film, a titanium nitride film, an aluminum film and another titanium nitride film is deposited over the insulating film 103 and the first protection film 107. Subsequently, the metal film is patterned into a first interconnection layer 110 connected to the impurity diffusion layer of the FET or the capacitor upper electrode 106. Thereafter, the first interconnection layer 110 is subjected to a first heat treatment carried out in a nitrogen atmosphere at 400° C. for 30 minutes, thereby increasing the density and reducing stress of the first interconnection layer 110.

Figure 1C:
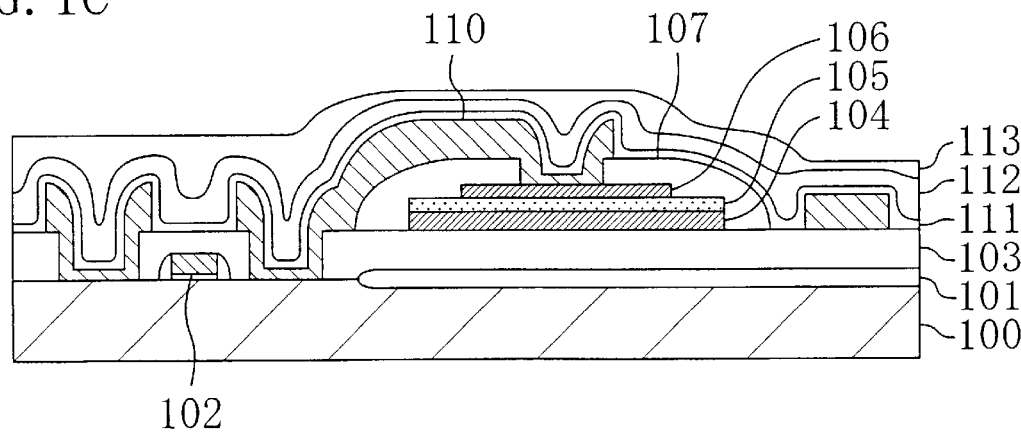

Next, as is shown in FIG. 1C, an underlying oxide film 111 with a thickness of, for example, 100 nm formed from a silicon oxide film including no impurity, a silicon oxide film including boron and phosphorus, a silicon oxide film including phosphorus or a silicon oxide film including boron is deposited over the first interconnection layer 110 and the first protection film 107 by atmospheric pressure CVD. Then, a first TEOS-$O_3$ film 112 with a thickness of, for example, 150 nm having a relatively large water content is grown on the underlying oxide film 111 by first TEOS-$O_3$ CVD where the ozone concentration is relatively low. Thereafter, a second TEOS-$O_3$ film 113 with a thickness of, for example, 0.3 µm through 1.7 µm having a relatively small water content is grown on the first TEOS-$O_3$ film 112 by second TEOS-$O_3$ CVD where the ozone concentration is relatively high.

The underlying oxide film 111, the first TEOS-$O_3$ film 112 and the second TEOS-$O_3$ film 113 together form an interlayer insulating film. In consideration of planarization by reflow, the interlayer insulating film has a thickness of approximately 1 µm or more in a portion on the first interconnection layer 110 above the capacitor upper electrode 106 and of approximately 2 µm or more in a portion on the first protection film 107 above the capacitor dielectric film 105.

Next, a second heat treatment is carried out in an oxygen atmosphere at 450° C. for 30 minutes through 1 hour, thereby increasing stress of the first and second TEOS-$O_3$ films 112 and 113 and supplying oxygen included in the first and second TEOS-$O_3$ films 112 and 113 to the capacitor dielectric film 105.

The first TEOS-$O_3$ CVD is preferably carried out by using mist of gaseous TEOS having a particle size larger than a predetermined value. In this manner, the quality of the first TEOS-$O_3$ film 112 can be improved.

Also, the first TEOS-$O_3$ CVD is preferably carried out by using mist of TEOS charged with positive or negative static electricity. In this manner, the first TEOS-$O_3$ film 112 can be increased in its thickness because it can be improved in its growth rate and loses dependency on the underlying film. In this case, when the semiconductor substrate 100 is charged with static electricity of polarity reverse to that of the mist of TEOS, the growth rate of the first TEOS-$O_3$ film 112 can be further improved.

A method of preparing the mist of gaseous TEOS, a method of setting the particle size of the mist to a predetermined value or smaller, a method of charging the mist with static electricity and a method of charging the semiconductor substrate 100 with static electricity will be described later in Embodiment 3.

Furthermore, the second TEOS-$O_3$ CVD is preferably carried out in a temperature range between 350° C. and 450° C. for growing the second TEOS-$O_3$ film 113. In this manner, the second heat treatment can be conducted at 450° C., and hence, the stress of the second TEOS-$O_3$ film 113 can be increased and the film quality of the second TEOS-$O_3$ film 113 can be made dense.

Figure 2A:
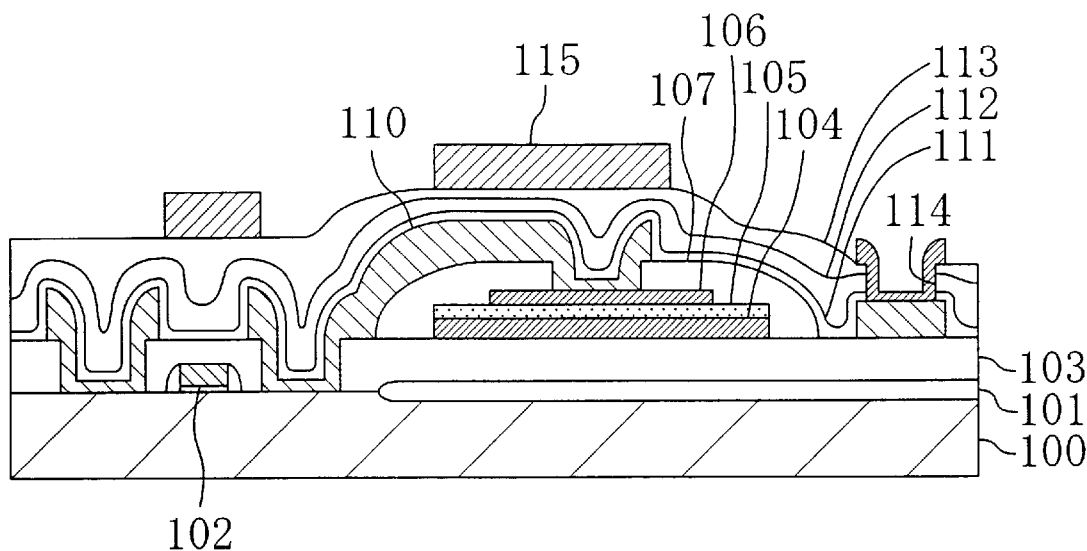
FIGS. 2A and 2B are cross-sectional views for showing other procedures in the method of fabricating a semiconductor device of Embodiment 1.

Next, as is shown in FIG. 2A, a contact hole 114 is formed in the interlayer insulating film consisting of the underlying oxide film 111, the first TEOS-$O_3$ film 112 and the second TEOS-$O_3$ film 113. Then, a second interconnection layer 115 of a multi-layer film including a titanium film, a titanium nitride film, an aluminum film and another titanium nitride film is formed on the second TEOS-$O_3$ film 113. Thereafter, a third heat treatment is carried out in a nitrogen atmosphere at 400° C. for 30 minutes, thereby increasing the density and reducing stress of the second interconnection layer 115.

Figure 2B:
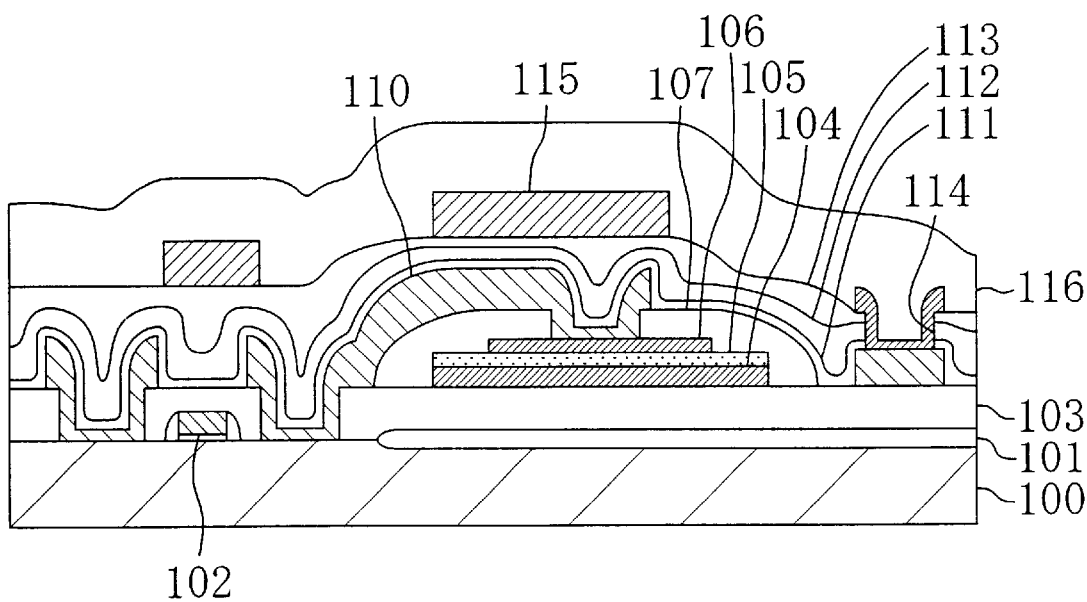

Then, as is shown in FIG. 2B, a second protection film 116 of a silicon nitride film is deposited by plasma CVD on the second TEOS-$O_3$ film 113 so as to cover the second interconnection layer 115. Thus, the semiconductor device of Embodiment 1 is completed.

According to Embodiment 1, the underlying oxide film 111 with no dependency on an underlying film and high conformability to a TEOS-$O_3$ film is deposited over the first interconnection layer 110 and the first protection film 107, and then, the first TEOS-$O_3$ film 112 is grown on the underlying oxide film 111. Therefore, the first TEOS-$O_3$ film 112 is satisfactorily grown without being affected by different materials used for the first interconnection layer 110 and the first protection film 107, namely, without being affected by the dependency on the underlying films. Accordingly, the first TEOS-$O_3$ film 112 can be formed in a uniform thickness, and hence, the interlayer insulating film attains a uniform thickness. As a result, the capacitor can attain high stability and a long life.

Furthermore, since the first TEOS-$O_3$ film 112 is formed by the first TEOS-$O_3$ CVD carried out at a relatively low ozone concentration, defects such as holes are not caused and the water content is relatively high in the first TEOS-$O_3$ film 112 thus grown. Since the water content of the first TEOS-$O_3$ film 112 is relatively high, its adhesion to the underlying oxide film 111 is improved.

Furthermore, since the second TEOS-$O_3$ film 113 is formed by the second TEOS-$O_3$ CVD carried out at a relatively high ozone concentration, the water content is relatively low in the second TEOS-$O_3$ film 113. Therefore, the second TEOS-$O_3$ film 113 applies large stress to the capacitor dielectric film 105 of the capacitor, and hence, the capacitor dielectric film 105 can attain satisfactory spontaneous polarization.

In order to attain satisfactory spontaneous polarization of the capacitor dielectric film 105 of the capacitor, the stress of the second TEOS-$O_3$ film 113 after the second heat treatment is preferably tensile stress of $4 \times 10^4$ N/cm$^2$ or less and $1 \times 10^2$ N/cm$^2$ or more. In this manner, the spontaneous polarization characteristic of the capacitor dielectric film 105 can be improved, resulting in improving the characteristics of the capacitor.

The second TEOS-$O_3$ film 113 preferably has a thickness of 0.3 $\mu$m through 1.7 $\mu$m. When the thickness of the second TEOS-$O_3$ film 113 exceeds 1.7 $\mu$m, there is a fear of cracks caused in the second heat treatment. When the thickness of the second TEOS-$O_3$ film 113 is smaller than 0.3 $\mu$m, the interlayer insulating film cannot attain desired planeness, and hence, there is a fear of etching residue or the like remaining in patterning the second interconnection layer 115.

The ozone concentration in the first TEOS-$O_3$ CVD (herein a concentration of an oxygen gas including ozone is designated as the ozone concentration for convenience) is 25 g/m$^3$ or less and is preferably 20 g/m$^3$ or less. When the ozone concentration is 25 g/m$^3$ or less, the first TEOS-$O_3$ film 112 can be free from imperfections such as defects owing to the self-reflow characteristic thereof. The lower limit of the ozone concentration is not herein specified as far as the first TEOS-$O_3$ film 112 can be grown.

In order to set the ozone concentration in the first TEOS-$O_3$ CVD to 25 g/m$^3$ or less, a value of (the flow rate of ozone/the flow rate of TEOS) is set to 3 or less.

The ozone concentration in the second TEOS-$O_3$ CVD is 130 g/m$^3$ or more and is preferably 150 g/m$^3$ or more. When the ozone concentration is 130 g/m$^3$ or more, sufficient stress can be applied to the capacitor dielectric film 105 and occurrence of cracks derived from the small water content can be prevented in the second TEOS-$O_3$ film 113 during the second heat treatment. The upper limit of the ozone concentration is not herein specified as far as the second TEOS-$O_3$ film 113 can be grown.

In order to set the ozone concentration in the second TEOS-$O_3$ CVD to 130 g/m$^3$ or more, the value of (the flow rate of ozone/the flow rate of TEOS) is set to 15 or more.

Figure 3:
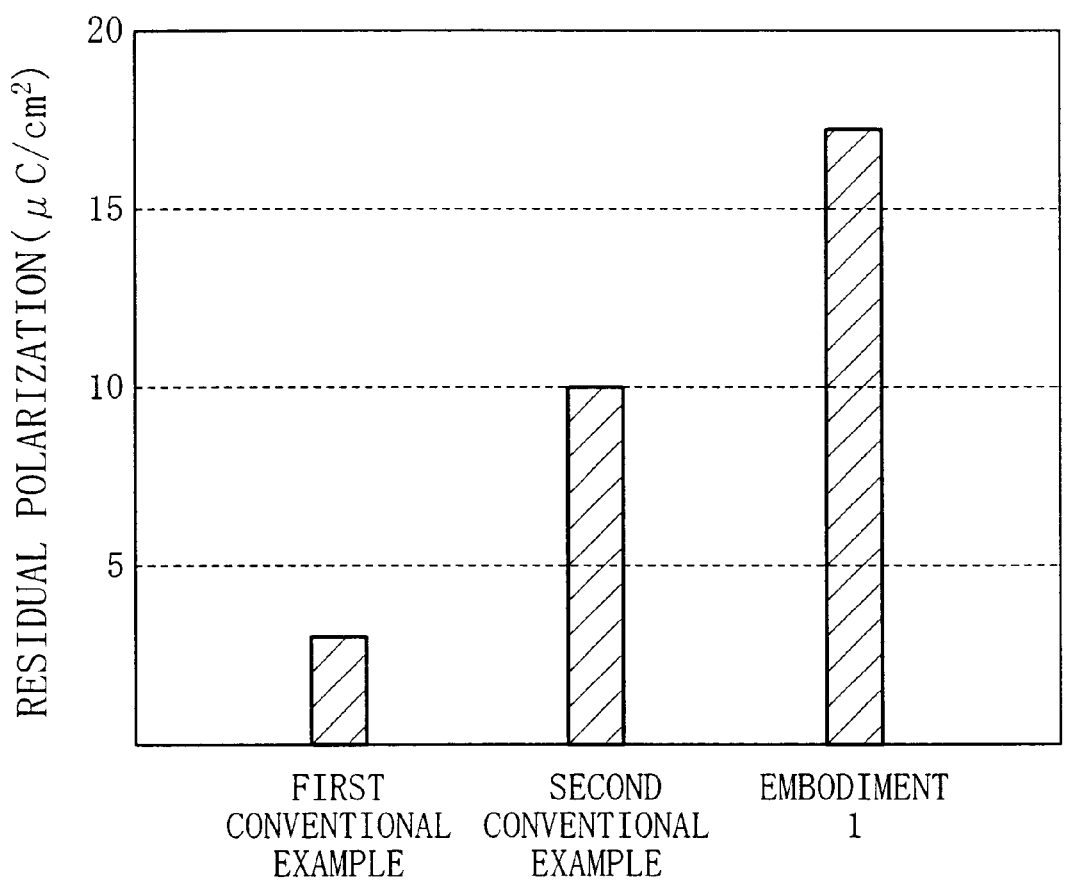
FIG. 3 is a graph of results of an experiment conducted for evaluating Embodiment 1, showing residual polarization of capacitor dielectric films of a first conventional example, a second conventional example and Embodiment 1.

FIG. 3 shows the results of an experiment carried out for evaluating Embodiment 1, and specifically shows the residual polarization of capacitor dielectric films of a first conventional example (using an interlayer insulating film of a plasma TEOS film), a second conventional example (using an interlayer insulating film of a single TEOS-$O_3$ film) and this embodiment (using the interlayer insulating film consisting of the underlying oxide film, the first TEOS-$O_3$ film and the second TEOS-$O_3$ film). The residual polarization is 3 $\mu$C/cm$^2$ in the first conventional example, 10 $\mu$C/cm$^2$ in the second conventional example and 17 $\mu$C/cm$^2$ in Embodiment 1. Thus, it is confirmed that the residual polarization of the capacitor dielectric film can be largely increased according to Embodiment 1.

Figure 4A:
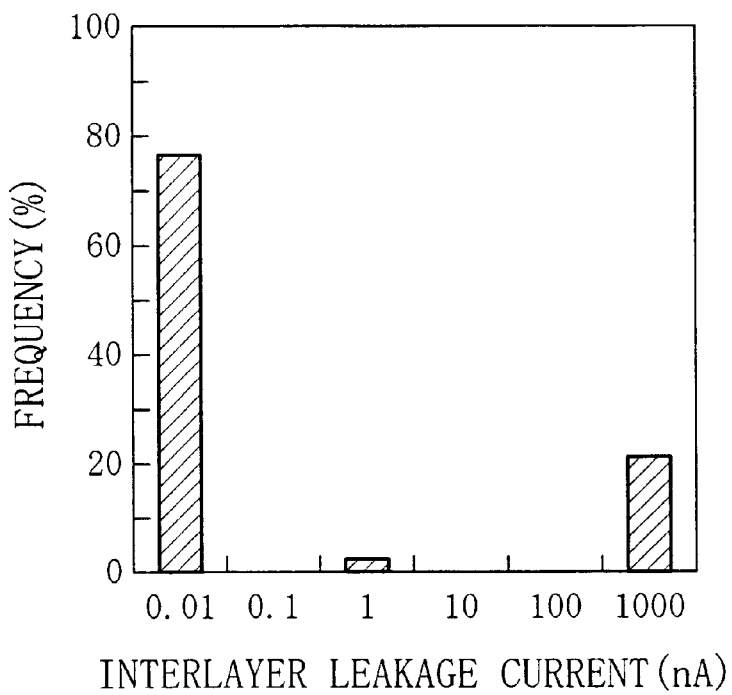
FIG. 4A is a diagram for showing a frequency that an interlayer leakage current is not caused in the second conventional example and FIG. 4B is a diagram for showing a frequency that an interlayer leakage current is not caused in Embodiment 1.
Figure 4B:
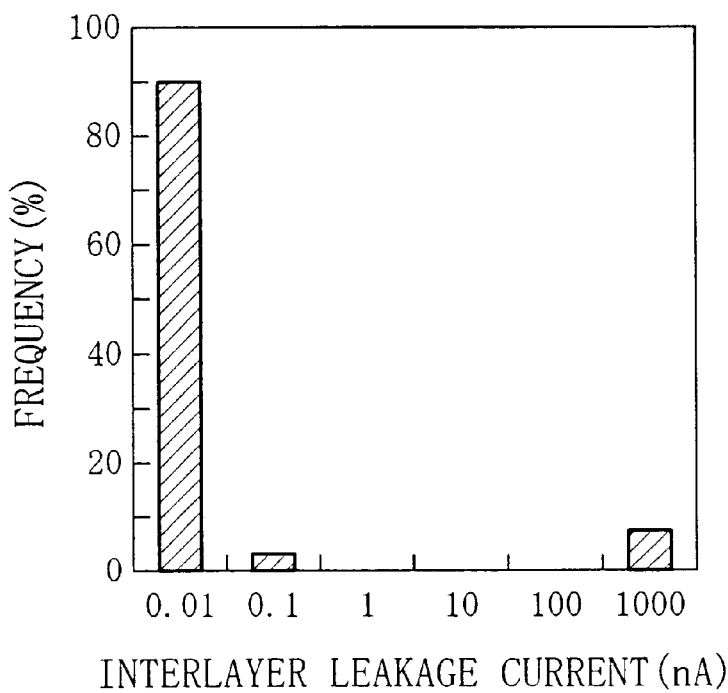

FIGS. 4A and 4B show the relationship between the amplitude and the frequency of an interlayer leakage current caused between the first interconnection layer and the second interconnection layer, and specifically, FIG. 4A shows the relationship obtained in the second conventional example and FIG. 4B shows the relationship obtained in Embodiment 1. The frequency of good products with an interlayer leakage current value of 0.01 nA is approximately 75% in the second conventional example and is approximately 90% in Embodiment 1. Thus, the frequency of good products is largely increased according to Embodiment 1.

Although the first and third heat treatments are carried out at 400° C. in this embodiment, these heat treatments may be conducted in a temperature range between 350° C. and 450° C.

The second heat treatment is carried out in an oxygen atmosphere at 450° C. in this embodiment, and an oxygen gas may be singly used or a mixed gas including an oxygen gas and another gas may be used as the oxygen atmosphere. Also, the second heat treatment may be conducted in a temperature range between 350° C. and 450° C.

In Embodiment 1, each of the first and second interconnection layers 110 and 115 is made from the multi-layer film including a titanium film, a titanium nitride film, an aluminum film and another titanium nitride film. Instead, each of the interconnection layers may be made from a multi-layer film including a titanium film and an aluminum film or a multi-layer film including a titanium film, an aluminum film and a titanium tungsten film.

Although the interlayer insulating film of Embodiment 1 consists of the underlying oxide film 111, the first TEOS-$O_3$ film 112 and the second TEOS-$O_3$ film 113, the interlayer insulating film may consist of the first TEOS-$O_3$ film 112 and the second TEOS-$O_3$ film 113 alone without forming the underlying oxide film 111 or the underlying oxide film 111 and the second TEOS-$O_3$ film 113 alone without forming the first TEOS-$O_3$ film 112.

Modification of Embodiment 1

A semiconductor device and a method of fabricating the same according to Modification of Embodiment 1 will now be described with reference to FIGS. 5A through 5C.

First, similarly to Embodiment 1, after forming an isolation region 101 and a gate electrode 102 of an FET on a semiconductor substrate 100, an insulating film 103 is deposited over the isolation region 101 and the gate electrode 102. Then, on a portion of the insulating film 103 above the isolation region 102, a capacitor including a capacitor lower electrode 104, a capacitor dielectric film 105 of a highly dielectric film or a ferroelectric film and a capacitor upper electrode 106 is formed (as is shown in FIG. 1A).

Next, similarly to Embodiment 1, a first protection film 107 of a silicon oxide film is deposited by the TEOS-$O_3$ CVD so as to cover the capacitor, and then, a contact hole 108 of the FET is formed in the insulating film 103 and a contact hole 109 of the capacitor is formed in the first protection film 107. Thereafter, a first interconnection layer 110 connected to an impurity diffusion layer of the FET or the capacitor upper electrode 106 is formed (as is shown in FIG. 1B).

Figure 5A:
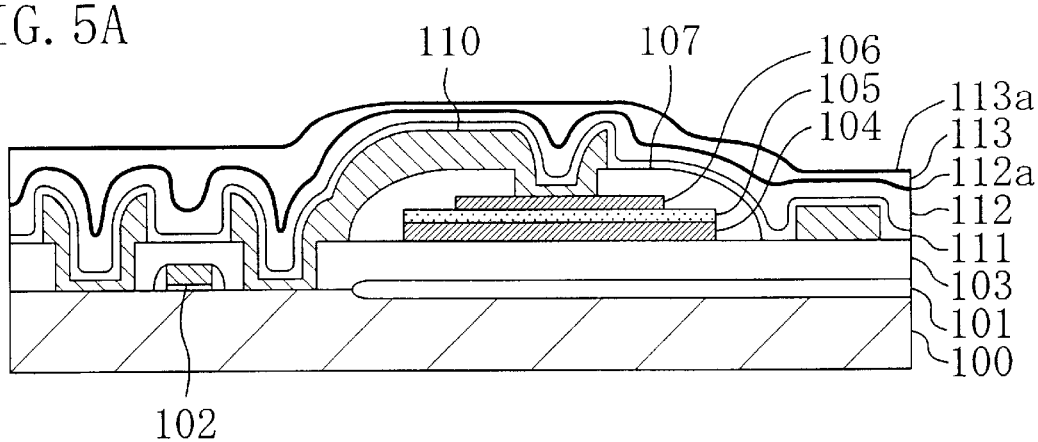
FIGS. 5A, 5B and 5C are cross-sectional views for showing procedures in a method of fabricating a semiconductor device according to Modification of Embodiment 1.

Then, as is shown in FIG. 5A, an underlying oxide film 111 with a thickness of, for example, 100 nm formed from a silicon oxide film including no impurity, a silicon oxide film including boron and phosphorus, a silicon oxide film including phosphorus or a silicon oxide film including boron is deposited over the first interconnection layer 110 and the first protection film 107 by the atmospheric pressure CVD. Thereafter, a first TEOS-$O_3$ film 112 with a thickness of, for example, 150 nm having a relatively large water content is grown on the underlying oxide film 111 by first TEOS-$O_3$ CVD where the ozone concentration is relatively low.

Subsequently, the first TEOS-$O_3$ film 112 is subjected to a first plasma treatment, thereby forming a first surface treatment layer 112a on a surface of the first TEOS-$O_3$ film 112.

The first plasma treatment is preferably plasma coating or plasma sputtering etching carried out by using plasma of a gas including at least one of a $N_2$ gas, a $NH_3$ gas, a $N_2O$ gas, an $O_2$ gas, an Ar gas, a $Cl_2$ gas and a $C_2F_6$ gas.

Since the first surface treatment layer 112a of a hardening layer with a thickness of approximately several nm is thus formed in the surface portion of the first TEOS-$O_3$ film 112, the ability to prevent diffusion of the water content of the first TEOS-$O_3$ film 112 can be improved.

Alternatively, the first plasma treatment is preferably nitriding carried out by using plasma of a gas including at least one of a $N_2$ gas, a $NH_3$ gas and a $N_2O$ gas.

In this manner, the first surface treatment layer 112a of a silicon nitride layer with high ability to prevent diffusion of the water content is formed in the surface portion of the first TEOS-$O_3$ film 112. Therefore, the water content of the first TEOS-$O_3$ film 112 can be prevented from diffusing into the capacitor dielectric film 105 or the water content in the air can be prevented from diffusing into the first TEOS-$O_3$ film 112.

Next, a second TEOS-$O_3$ film 113 with a thickness of, for example, 0.3 μm through 1.7 μm having a relatively small water content is grown on the first TEOS-$O_3$ film 112 having the first surface treatment layer 112a by second TEOS-$O_3$ CVD where the ozone concentration is relatively high.

Thereafter, the second TEOS-$O_3$ film 113 is subjected to a second plasma treatment, there by forming a second surface treatment layer 113a on a surface of the second TEOS-$O_3$ film 113.

The second plasma treatment is preferably plasma coating or plasma sputtering etching carried out by using plasma of a gas including at least one of a $N_2$ gas, a $NH_3$ gas, a $N_2O$ gas, an $O_2$ gas, an Ar gas, a $Cl_2$ gas and a $C_2F_6$ gas.

Since the second surface treatment layer 113a of a hardening layer with a thickness of approximately several nm is thus formed in the surface portion of the second TEOS-$O_3$ film 113, the ability to prevent diffusion of the water content of the second TEOS-$O_3$ film 113 can be improved.

Alternatively, the second plasma treatment is preferably nitriding carried out by using plasma of a gas including at least one of a $N_2$ gas, a $NH_3$ gas and a $N_2O$ gas.

In this manner, the second surface treatment layer 113a of a silicon nitride layer with high ability to prevent diffusion of the water content is formed in the surface portion of the second TEOS-$O_3$ film 113. Therefore, the water content of the second TEOS-$O_3$ film 113 can be prevented from diffusing into the capacitor dielectric film 105 or the water content in the air can be prevented from diffusing into the second TEOS-$O_3$ film 113.

Figure 5B:
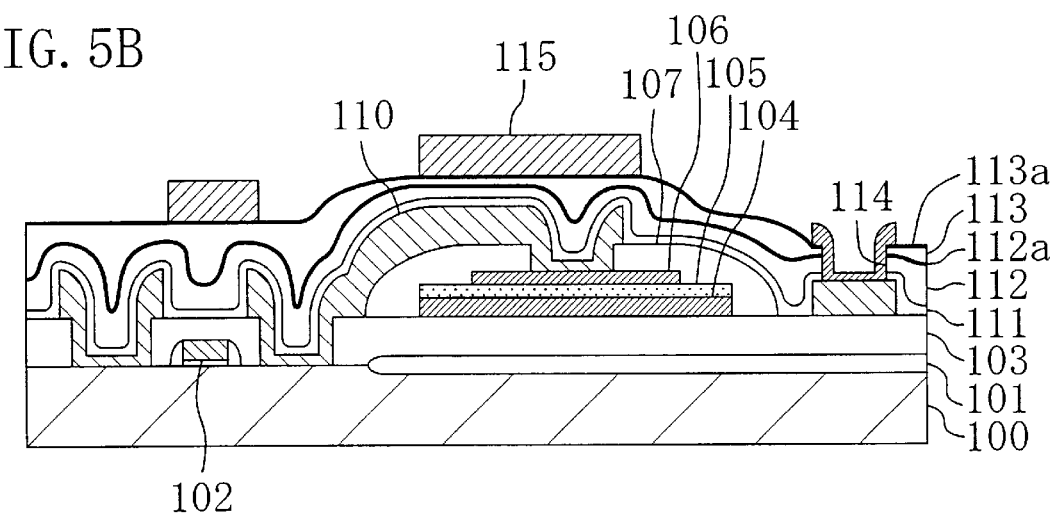

Next, as is shown in FIG. 5B, similarly to Embodiment 1, a contact hole 114 is formed in the interlayer insulating film consisting of the underlying oxide film 111, the first TEOS-$O_3$ film 112 and the second TEOS-$O_3$ film 113, and then, a second interconnection layer 115 is formed on the second TEOS-$O_3$ film 113.

Figure 5C:
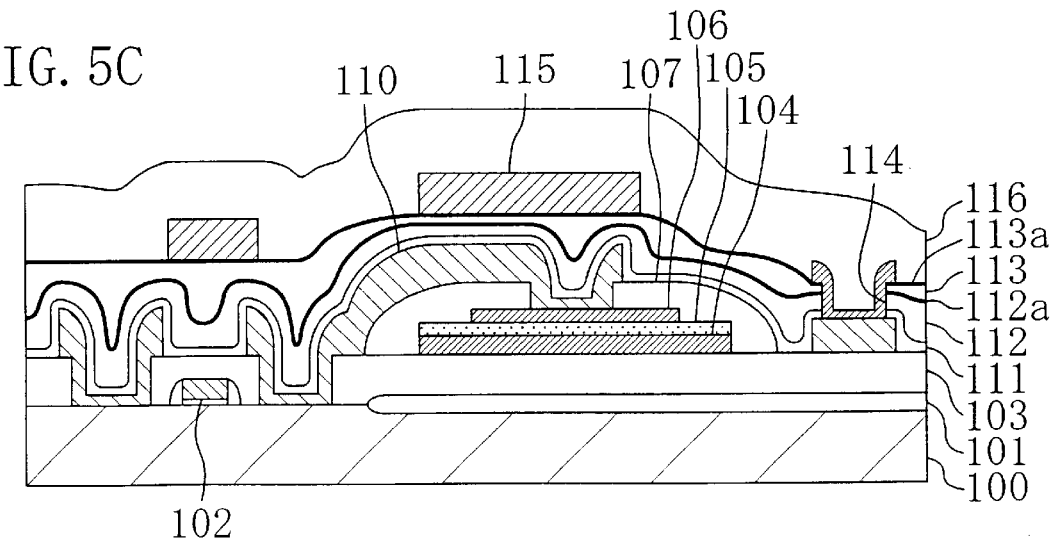

Subsequently, as is shown in FIG. 5C, similarly to Embodiment 1, a second protection film 116 is deposited on the second TEOS-$O_3$ film 113 by the plasma CVD so as to cover the second interconnection layer 115. Thus, the semiconductor device according to Modification of Embodiment 1 is completed.

In this modification, the second surface treatment layer 113a is formed in the surface portion of the second TEOS-$O_3$ film 113 by subjecting the second TEOS-$O_3$ film 113 to the second plasma treatment immediately after growing the second TEOS-$O_3$ film 113. Instead, the second surface treatment layer 113a may be formed by conducting the second plasma treatment after planarizing the second TEOS-$O_3$ film 113, after forming the contact hole 114 in the second TEOS-$O_3$ film 113 or after forming the second interconnection layer 115 on the second TEOS-$O_3$ film 113.

Embodiment 2

A semiconductor device and a method of fabricating the same according to Embodiment 2 of the invention will now be described with reference to FIGS. 6A through 6C, 7A and 7B.

Figure 6A:
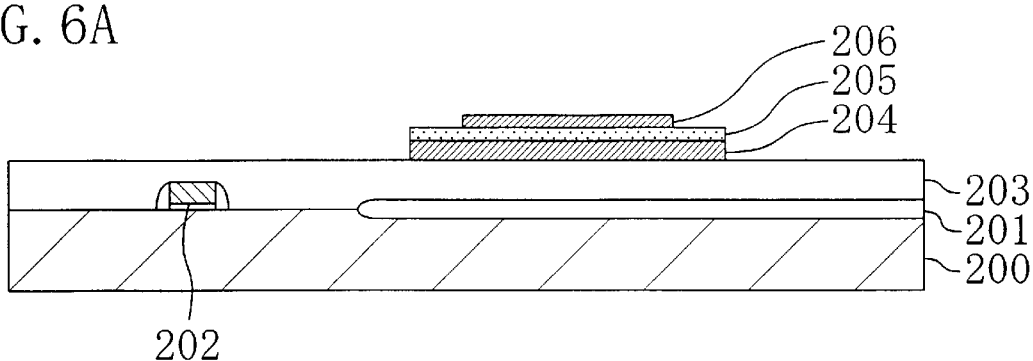
FIGS. 6A, 6B and 6C are cross-sectional views for showing procedures in a method of fabricating a semiconductor device according to Embodiment 2 of the invention.

First, as is shown in FIG. 6A, after forming an isolation region 201 and a gate electrode 202 of an FET on a semiconductor substrate 200, impurity diffusion layers and the like (not shown) of the FET are formed in a surface portion of the semiconductor substrate 200. Thereafter, an insulating film 203 is deposited over the isolation region 201 and the gate electrode 202.

Next, on a portion of the insulating film 203 above the isolation region 202, a capacitor lower electrode 204, a capacitor dielectric film 205 of a highly dielectric film or a ferroelectric film and a capacitor upper electrode 206 are formed. The capacitor lower electrode 204, the capacitor dielectric film 205 and the capacitor upper electrode 206 together form a capacitor.

Each of the capacitor lower electrode 204 and the capacitor upper electrode 206 can be formed by depositing, by sputtering, a metal film formed from a single layer of platinum, indium, palladium, ruthenium or alloy of two or more of these metals or a multi-layer film including two or more of a platinum film, an indium film, a palladium film and a ruthenium film, and patterning the metal film.

Also, the capacitor dielectric film 205 can be formed from a highly dielectric film or a ferroelectric film including strontium, bismuth or tantalum as a main component.

Figure 6B:
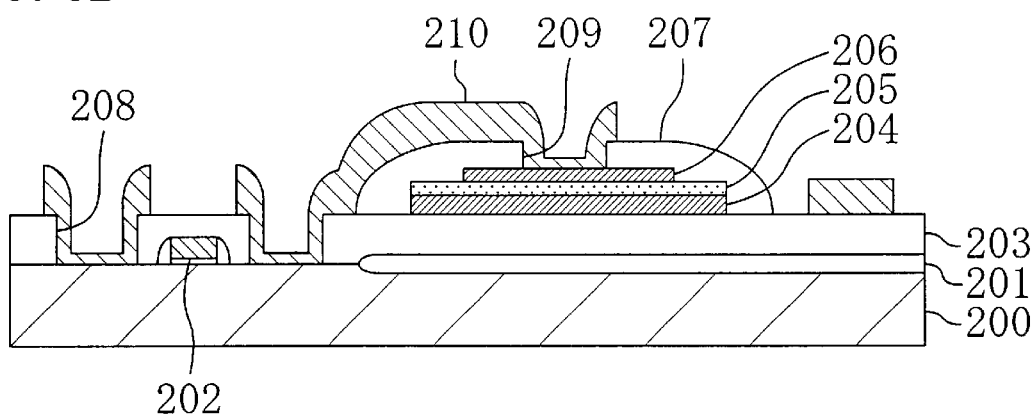

Next, as is shown in FIG. 6B, a first protection film 207 of a silicon oxide film is deposited by the TEOS-$O_3$ CVD so as to cover the capacitor. The first protection film 207 can be formed from, for example, a silicon oxide film including no impurity, a silicon oxide film including boron and phosphorus, a silicon oxide film including phosphorus or a silicon oxide film including boron. When the first protection film 207 is thus formed by the TEOS-$O_3$ CVD, not only the first protection film 207 can be improved in its surface planeness but also the capacitor can be stabilized and become long-lived.

Then, after forming a contact hole 208 of the FET in the insulating film 203 and a contact hole 209 of the capacitor in the first protection film 207, a metal film of a multi-layer film including a titanium film, a titanium nitride film, an aluminum film and another titanium nitride film is deposited over the insulating film 203 and the first protection film 207. Subsequently, the metal film is patterned into a first interconnection layer 210 connected to the impurity diffusion layer of the FET or the capacitor upper electrode 206. Thereafter, the first interconnection layer 210 is subjected to a first heat treatment carried out in a nitrogen atmosphere at 400° C. for 30 minutes, thereby increasing the density and reducing stress of the first interconnection layer 210.

Figure 6C:
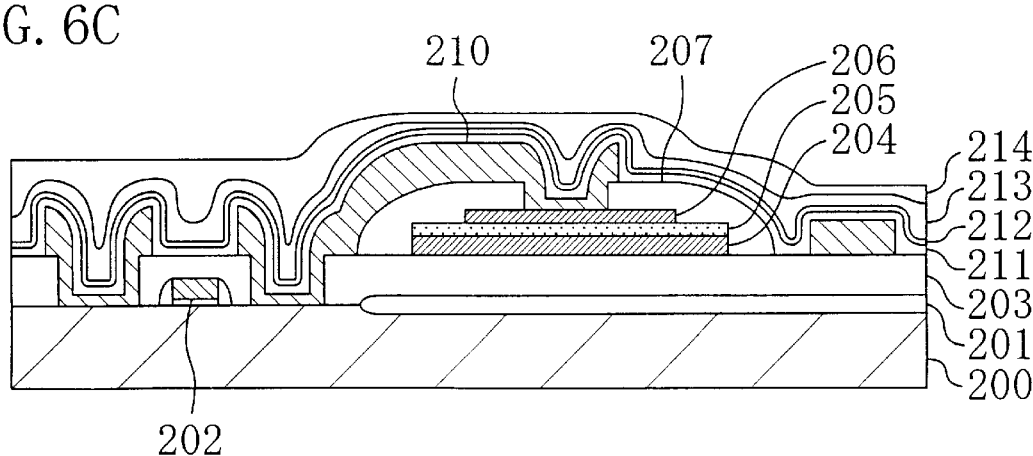

Next, as is shown in FIG. 6C, an underlying oxide film 211 with a thickness of, for example, 100 nm formed from a silicon oxide film including no impurity, a silicon oxide film including boron and phosphorus, a silicon oxide film including phosphorus or a silicon oxide film including boron is deposited over the first interconnection layer 210 and the first protection film 207 by the atmospheric pressure CVD. Then, a hydrophobic primer layer 212 with a thickness of 2 through 5 nm is formed on the underlying oxide film 211. The primer layer 212 can be formed by supplying a gaseous primer agent, such as HMDS (hexamethyldisilazane), onto the surface of the semiconductor substrate 200.

Next, a first TEOS-$O_3$ film 213 with a thickness of, for example, 150 nm having a relatively large water content is grown on the primer layer 212 by first TEOS-$O_3$ CVD where the ozone concentration is relatively low. Thereafter, a second TEOS-$O_3$ film 214 with a thickness of, for example, 0.3 $\mu$m through 1.7 $\mu$m having a relatively small water content is grown on the first TEOS-$O_3$ film 213 by second TEOS-$O_3$ CVD where the ozone concentration is relatively high.

The underlying oxide film 211, the primer layer 212, the first TEOS-$O_3$ film 213 and the second TEOS-$O_3$ film 214 together form an interlayer insulating film. In consideration of planarization by reflow, the interlayer insulating film has a thickness of approximately 1 $\mu$m or more in a portion on the first interconnection layer 210 above the capacitor upper electrode 206 and of approximately 2 $\mu$m or more in a portion on the first protection film 207 above the capacitor dielectric film 205.

Next, a second heat treatment is carried out in an oxygen atmosphere at 450° C. for 1 hour, thereby increasing stress of the first and second TEOS-$O_3$ films 213 and 214 and supplying oxygen included in the first and second TSOS-$O_3$ films 213 and 214 to the capacitor dielectric film 205.

Figure 7A:
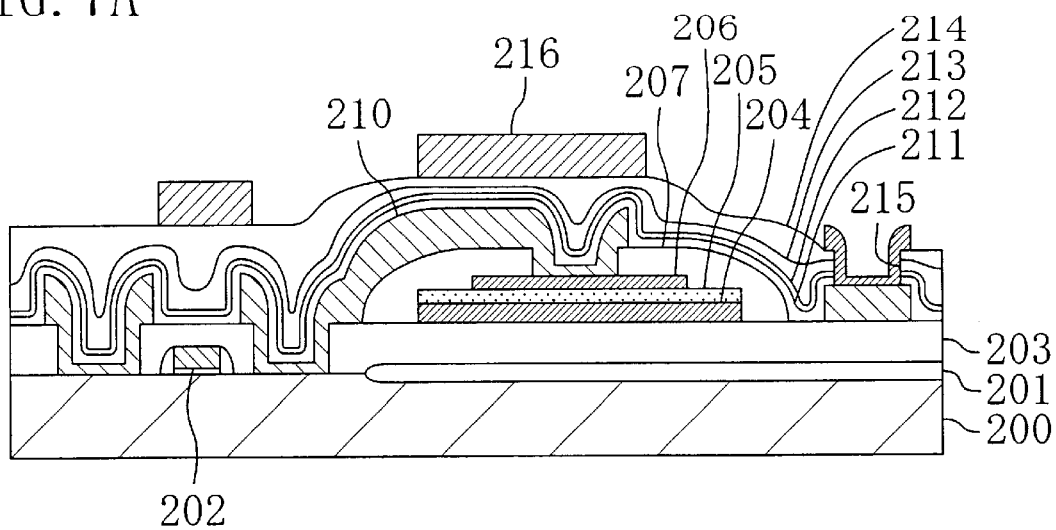
FIGS. 7A and 7B are cross-sectional views for showing other procedures in the method of fabricating a semiconductor device of Embodiment 2.

Subsequently, as is shown in FIG. 7A, a contact hole 215 is formed in the interlayer insulating film consisting of the underlying oxide film 211, the primer layer 212, the first TEOS-$O_3$ film 213 and the second TEOS-$O_3$ film 214, and then, a second interconnection layer 216 of a multi-layer film including a titanium film, a titanium nitride film, an aluminum film and another titanium nitride film is formed on the second TEOS-$O_3$ film 214. Thereafter, a third heat treatment is carried out in a nitrogen atmosphere at 400° C. for 30 minutes, thereby increasing the density and reducing stress of the second interconnection layer 216.

Figure 7B:
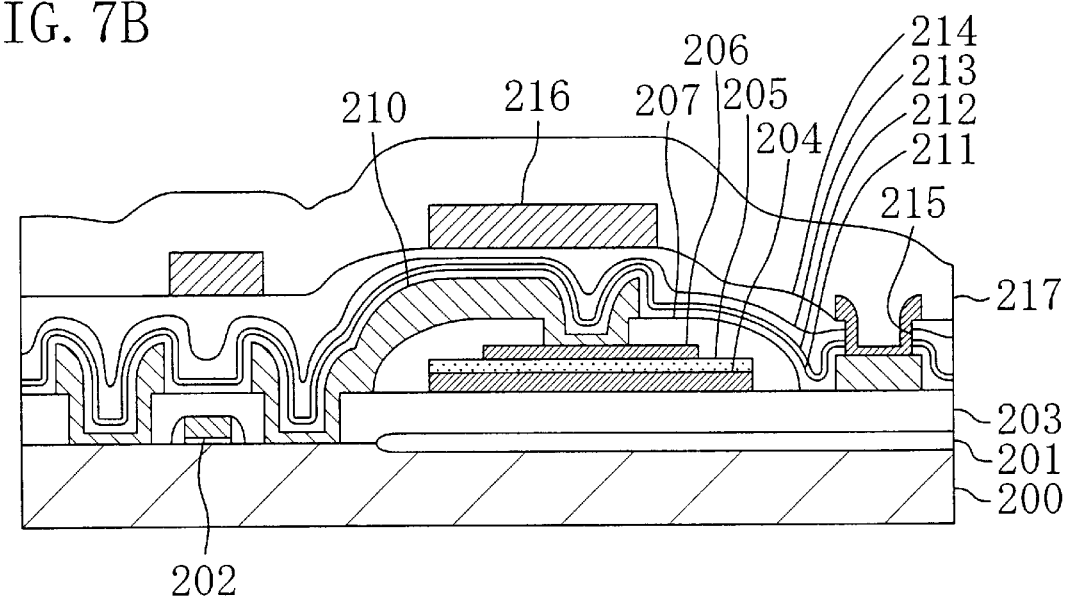

Next, as is shown in FIG. 7B, a second protection film 217 of a silicon nitride film is deposited by the plasma CVD on the second TEOS-$O_3$ film 214 so as to cover the second interconnection layer 216. Thus, the semiconductor device of Embodiment 2 is completed.

According to Embodiment 2, the underlying oxide film 211 with no dependency on an underlying film and high conformability to the first TEOS-$O_3$ film 213 is formed between the first interconnection layer 210 and the first protection film 207 and the first TEOS-$O_3$ film 213. Therefore, the first TEOS-$O_3$ film 213 can be formed in a uniform thickness because it is grown without being affected by the different materials used for the first interconnection layer 210 and the first protection film 207, namely, without being affected by the dependency on underlying films.

Furthermore, since the first TEOS-$O_3$ film 213 is grown on the primer layer 212 after forming the hydrophobic primer layer 212 on the underlying oxide film 211, the first TEOS-$O_3$ film 213 can be more satisfactorily grown. Specifically, since a TEOS-$O_3$ film has a property to satisfactorily grow on a hydrophobic film, when the first TEOS-$O_3$ film 213 is grown after making hydrophobic the surface of the underlying oxide film 211 by forming the hydrophobic primer layer 212 thereon as in Embodiment 2, the resultant first TEOS-$O_3$ film 213 can attain good step coverage, and accordingly, the interlayer insulating film can attain good step coverage.

Furthermore, since the first TEOS-$O_3$ film 213 is formed through the first TEOS-$O_3$ CVD where the ozone concentration is relatively low, defects such as holes are not formed and the water content is relatively large in the first TEOS-$O_3$ film 213. Since the first TEOS-$O_3$ film 213 has a relatively large water content, its adhesion to the underlying oxide film 211 can be improved.

Moreover, since the second TEOS-$O_3$ film 214 is formed through the second TEOS-$O_3$ CVD where the ozone concentration is relatively high, it has a relatively small water content. Therefore, the second TEOS-$O_3$ film 214 applies large stress to the capacitor dielectric film 205 of the capacitor, and hence, the capacitor dielectric film 205 can attain satisfactory spontaneous polarization.

Figure 8A:
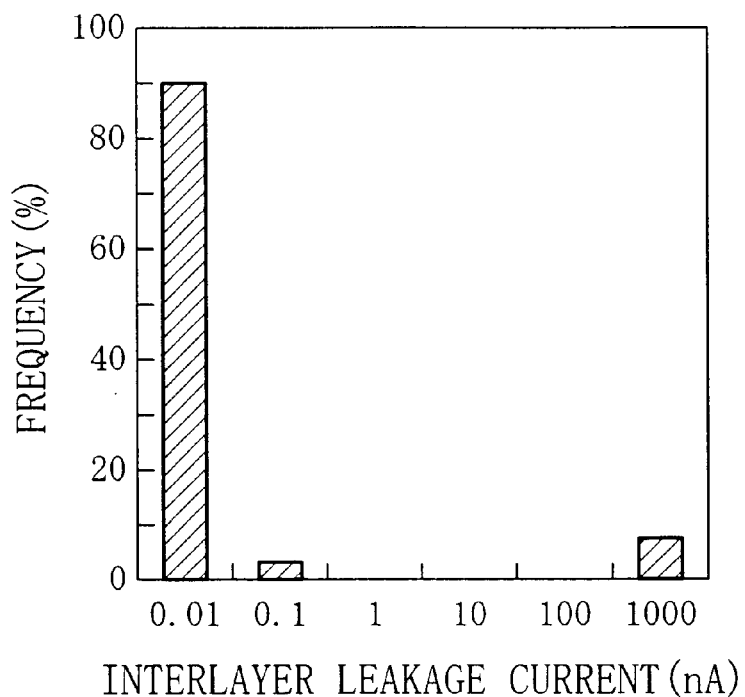
FIG. 8A is a diagram for showing the frequency that an interlayer leakage current is not caused in Embodiment 1 and FIG. 8B is a diagram for showing a frequency that an interlayer leakage current is not caused in Embodiment 2.
Figure 8B:
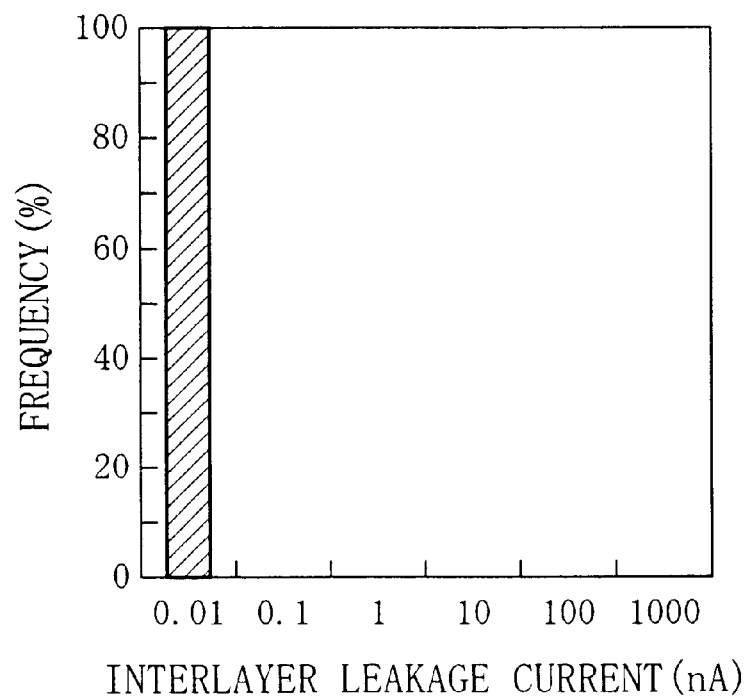

FIGS. 8A and 8B show the relationship between the amplitude and the frequency of an interlayer leakage current caused between the first interconnection layer and the second interconnection layer, and specifically, FIG. 8A shows the relationship obtained in Embodiment 1 and FIG. 8B shows the relationship obtained in Embodiment 2. The frequency of good products with an interlayer leakage current value of 0.01 nA is approximately 90% in Embodiment 1 but is 100% in Embodiment 2. Thus, the frequency of good products is largely improved according to Embodiment 2 as compared with that in Embodiment 1.

The second TEOS-$O_3$ film 214 preferably has a thickness of 0.3 $\mu$m through 1.7 $\mu$m as in Embodiment 1.

Also similarly to Embodiment 1, the ozone concentration in the first TEOS-$O_3$ CVD is preferably 25 g/m$^3$ or less and more preferably 20 g/m$^3$ or less, and the ozone concentration in the second TEOS-$O_3$CVD is preferably 130 g/m$^3$ or more and more preferably 150 g/m$^3$ or more.

In Embodiment 2, the interlayer insulating film consists of the underlying oxide film 211, the primer layer 212, the first TEOS-$O_3$ film 213 and the second TEOS-$O_3$ film 214. Instead, the interlayer insulating film can consist of the primer layer 212, the first TEOS-$O_3$ film 213 and the second TEOS-$O_3$ film 214 alone without forming the underlying oxide film 211, or the underlying oxide film 211, the primer layer 212 and the second TEOS-$O_3$ film 214 alone without forming the first TEOS-$O_3$ film 213.

Modification of Embodiment 2

A semiconductor device and a method of fabricating the same according to Modification of Embodiment 2 will now be described with reference to FIGS. 9A through 9C.

First, similarly to Embodiment 2, after forming an isolation region 201 and a gate electrode 202 of an FET on a semiconductor substrate 200, an insulating film 203 is deposited over the isolation region 201 and the gate electrode 202. Then, on a portion of the insulating film 203 above the isolation region 202, a capacitor consisting of a capacitor lower electrode 204, a capacitor dielectric film 205 of a highly dielectric film or a ferroelectric film and a capacitor upper electrode 206 is formed (as is shown in FIG. 6A).

Next, similarly to Embodiment 2, a first protection film 207 of a silicon oxide film is deposited by the TEOS-$O_3$ CVD so as to cover the capacitor, and then, a contact hole 208 of the FET is formed in the insulating film 203 and a contact hole 209 of the capacitor is formed in the first protection film 207. Thereafter, a first interconnection layer 210 connected to an impurity diffusion layer of the FET or the capacitor upper electrode 206 is formed (as is shown in FIG. 6B).

Figure 9A:
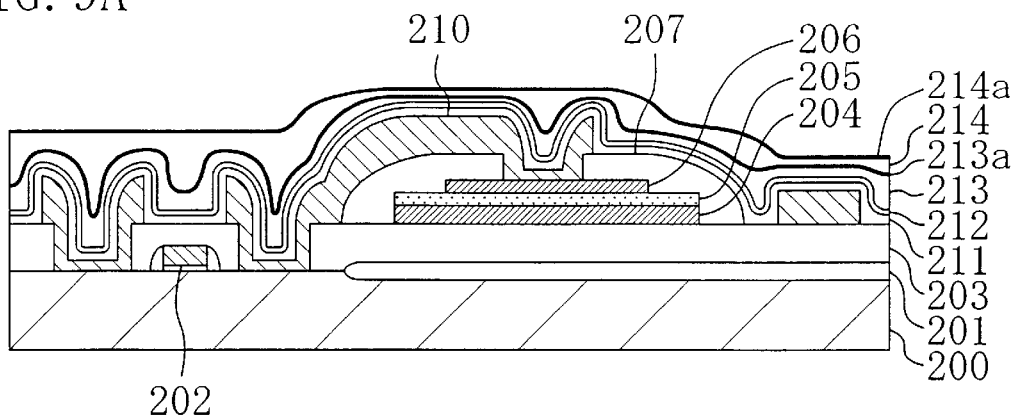
FIGS. 9A, 9B and 9C are cross-sectional views for showing procedures in a method of fabricating a semiconductor device according to Modification of Embodiment 2.

Then, as is shown in FIG. 9A, an underlying oxide film 211 with a thickness of, for example, 100 nm formed from a silicon oxide film including no impurity, a silicon oxide film including boron and phosphorus, a silicon oxide film including phosphorus or a silicon oxide film including boron is deposited over the first interconnection layer 210 and the first protection film 207 by the atmospheric pressure CVD. Thereafter, a hydrophobic primer layer 212 with a thickness of 2 through 5 nm is formed on the underlying oxide film 211.

Next, a first TEOS-$O_3$ film 213 with a thickness of, for example, 150 nm having a relatively large water content is grown on the primer layer 212 by first TEOS-$O_3$ CVD where the ozone concentration is relatively low.

Subsequently, the first TEOS-$O_3$ film 213 is subjected to a first plasma treatment, thereby forming a first surface treatment layer 213a on a surface of the first TEOS-$O_3$ film 213.

The first plasma treatment is preferably plasma coating or plasma sputtering etching carried out by using plasma of a gas including at least one of a $N_2$ gas, a $NH_3$ gas, a $N_2O$ gas, an $O_2$ gas, an Ar gas, a $Cl_2$ gas and a $C_2F_6$ gas.

Since the first surface treatment layer 213a of a hardening layer with a thickness of approximately several nm is thus formed in the surface portion of the first TEOS-$O_3$ film 213, the ability to prevent diffusion of the water content of the first TEOS-$O_3$ film 213 can be improved.

Alternatively, the first plasma treatment is preferably nitriding carried out by using plasma of a gas including at least one of a $N_2$ gas, a $NH_3$ gas and a $N_2O$ gas.

In this manner, the first surface treatment layer 213a of a silicon nitride layer with high ability to prevent diffusion of the water content is formed in the surface portion of the first TEOS-$O_3$ film 213. Therefore, the water content of the first TEOS-$O_3$ film 213 can be prevented from diffusing into the capacitor dielectric film 205 or the water content in the air can be prevented from diffusing into the first TEOS-$O_3$ film 213.

Next, a second TEOS-$O_3$ film 214 with a thickness of, for example, 0.3 $\mu$m through 1.7 $\mu$m having a relatively small water content is grown on the first TEOS-$O_3$ film 213 having the first surface treatment layer 213a by second TEOS-$O_3$ CVD where the ozone concentration is relatively high.

Thereafter, the second TEOS-$O_3$ film 214 is subjected to a second plasma treatment, thereby forming a second surface treatment layer 214a on a surface of the second TEOS-$O_3$ film 214.

The second plasma treatment is preferably plasma coating or plasma sputtering etching carried out by using plasma of a gas including at least one of a $N_2$ gas, a $NH_3$ gas, a $N_2O$ gas, an $O_2$ gas, an Ar gas, a $Cl_2$ gas and a $C_2F_6$ gas.

Since the second surface treatment layer 214a of a hardening layer with a thickness of approximately several nm is thus formed in the surface portion of the second TEOS-$O_3$ film 214, the ability to prevent diffusion of the water content of the second TEOS-$O_3$ film 214 can be improved.

Alternatively, the second plasma treatment is preferably nitriding carried out by using plasma of a gas including at least one of a $N_2$ gas, a $NH_3$ gas and a $N_2O$ gas.

In this manner, the second surface treatment layer 214a of a silicon nitride layer with high ability to prevent diffusion of the water content is formed in the surface portion of the second TEOS-$O_3$ film 214. Therefore, the water content of the second TEOS-$O_3$ film 214 can be prevented from diffusing into the capacitor dielectric film 205 or the water content in the air can be prevented from diffusing into the second TEOS-$O_3$ film 214.

Figure 9B:
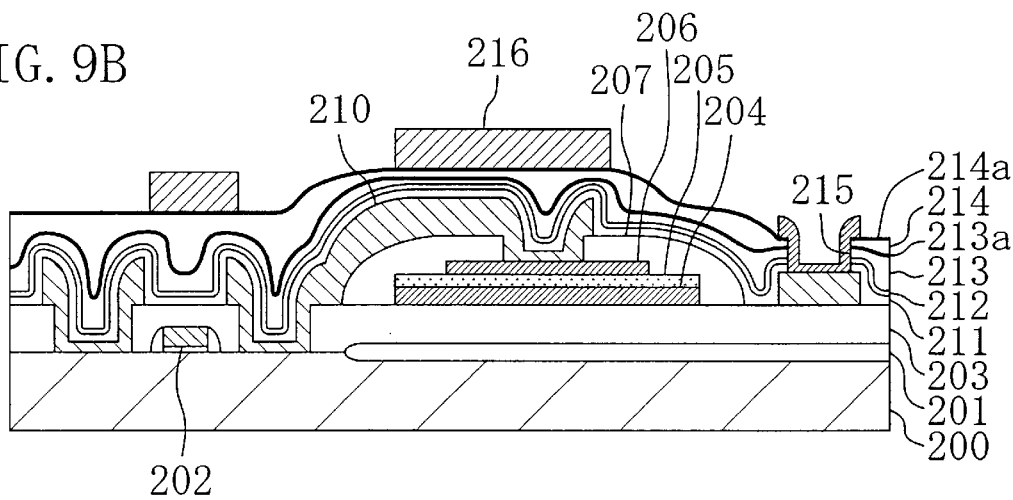

Next, as is shown in FIG. 9B, a contact hole 215 is formed in the interlayer insulating film consisting of the underlying oxide film 211, the primer layer 212, the first TEOS-$O_3$ film 213 and the second TEOS-$O_3$ film 214, and then, a second interconnection layer 216 is formed on the second TEOS-$O_3$ film 214.

Figure 9C:
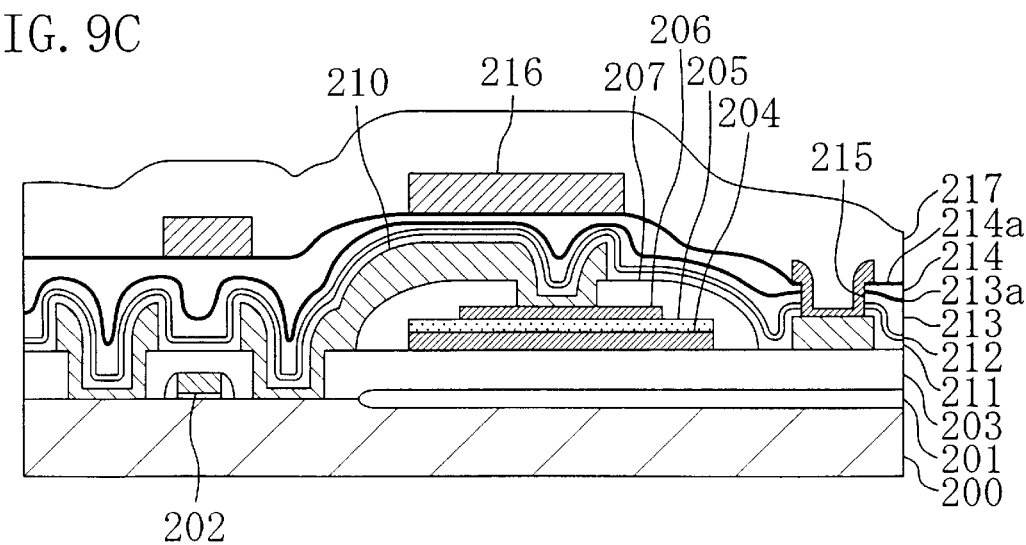

Subsequently, as is shown in FIG. 9C, similarly to Embodiment 2, a second protection film 217 is deposited on the second TEOS-$O_3$ film 214 by the plasma CVD so as to cover the second interconnection layer 216. Thus, the semiconductor device according to Modification of Embodiment 2 is completed.

In this modification, the second surface treatment layer 214a is formed in the surface portion of the second TEOS-$O_3$ film 214 by subjecting the second TEOS-$O_3$ film 214 to the second plasma treatment immediately after growing the second TEOS-$O_3$ film 214. Instead, the second surface treatment layer 214a may be formed by conducting the second plasma treatment after planarizing the second TEOS-$O_3$ film 214, after forming the contact hole 215 in the second TEOS-$O_3$ film 214 or after forming the second interconnection layer 216 on the second TEOS-$O_3$ film 214.

Embodiment 3

A fabrication system for fabricating the semiconductor device of Embodiment 1 or 2 will be described in Embodiment 3 with reference to FIG. 10.

Figure 10:
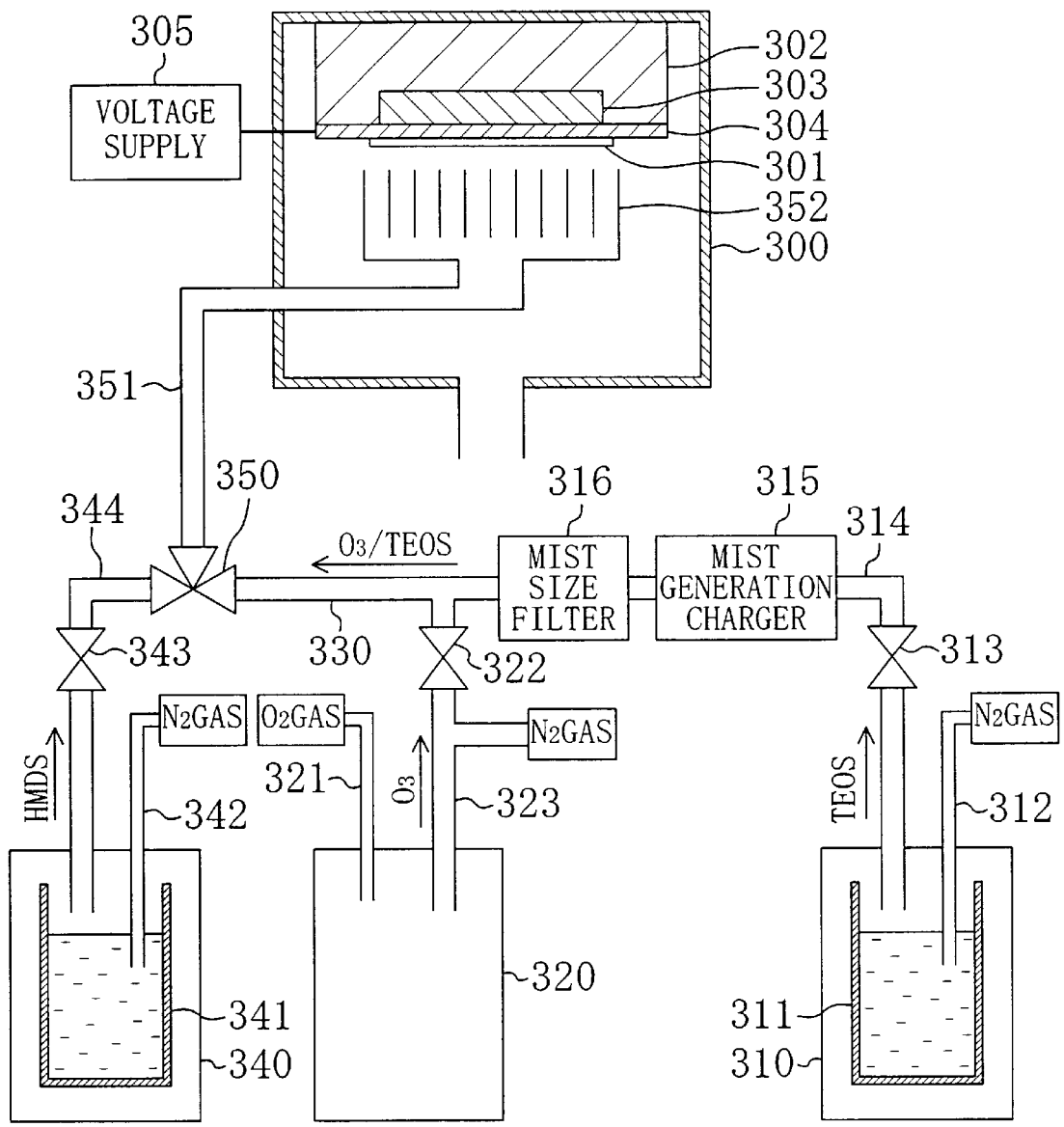
FIG. 10 is a schematic diagram for showing the entire structure of a system for fabricating a semiconductor device according to this invention.
Figure 11A:
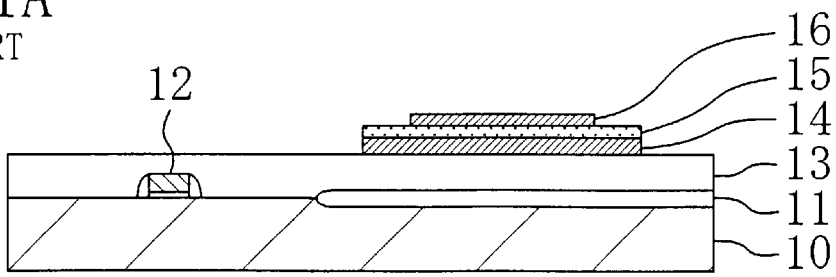
FIGS. 11A, 11B and 11C are cross-sectional views for showing procedures in a conventional method of fabricating a semiconductor device.
Figure 11B:
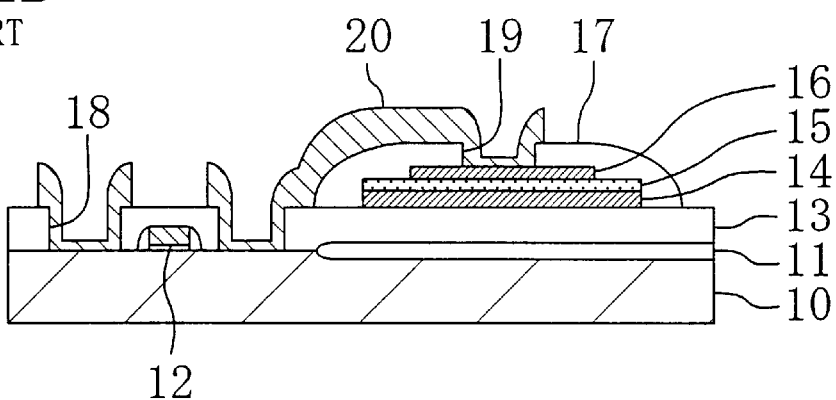
Figure 11C:
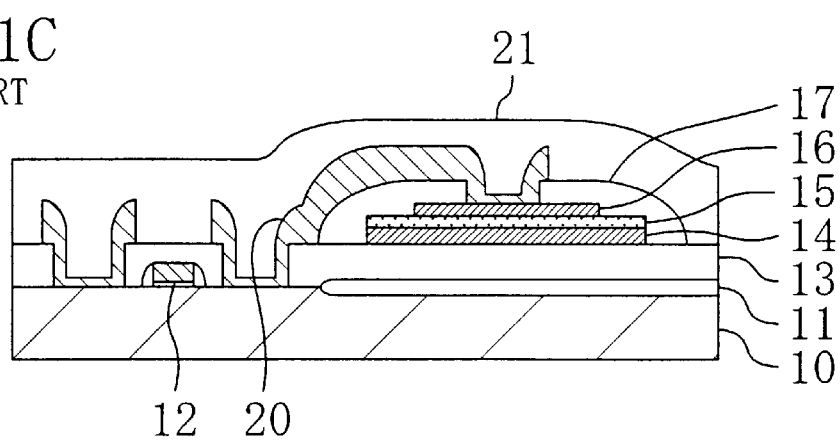
Figure 12A:
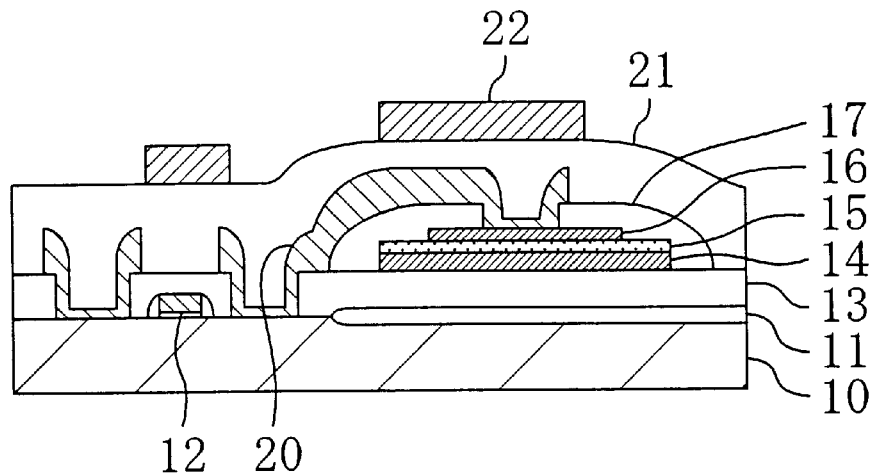
FIGS. 12A and 12B are cross-sectional views for showing other procedures in the conventional method of fabricating a semiconductor device.
Figure 12B:
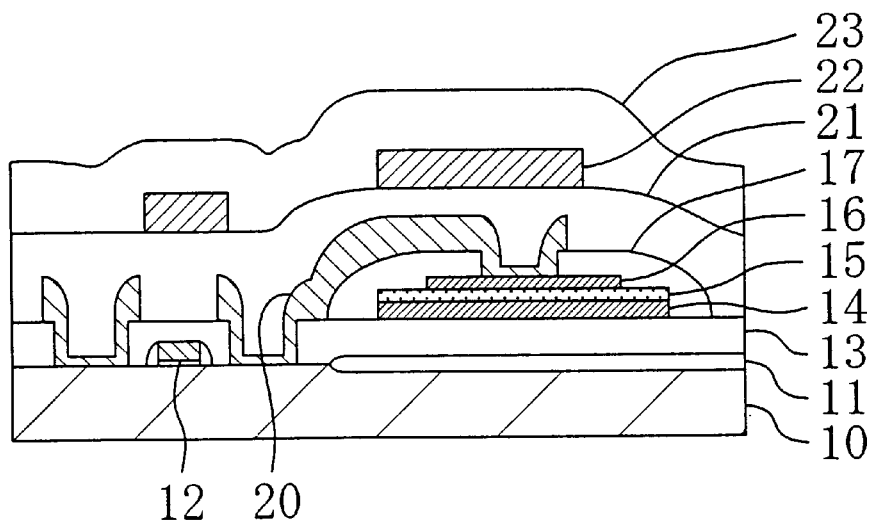

FIG. 10 schematically shows the entire structure of the fabrication system for a semiconductor device. As is shown in FIG. 10, a substrate holder 302 for holding a semiconductor substrate 301 is disposed in an upper portion within a chamber 300. The substrate holder 302 is provided on its lower portion with a heater 303 for heating the semiconductor substrate 301 and an adsorption plate 304 for electrostatically adsorbing the semiconductor substrate 301. The adsorption plate 304 is connected to a voltage supply 305 for applying a voltage to the absorption plate 304 so as to electrostatically adsorb the semiconductor substrate 301 and charge the semiconductor substrate 301 with positive or negative static electricity.

A TEOS heat insulator 310 is provided outside the chamber 300, and the TEOS heat insulator 310 contains a TEOS storage vessel 311 for storing a TEOS solution. A nitrogen supplying pipe 312 extends to the inside of the TEOS storage vessel 311, so as to bubble the TEOS solution with a nitrogen gas supplied through the nitrogen supply pipe 312. One end of a TEOS supply pipe 314 provided with a flow adjusting valve 313 extends to a portion above the TEOS storage vessel 311, so that TEOS changed into a gas by bubbling is sent toward the other end of the TEOS supply pipe 314 with its flow rate adjusted. In the middle of the TEOS supply pipe 314, a mist generation charger 315 and a mist size filter 316 are disposed.

The mist generation charger 315 changes the gaseous TEOS into mist and charges the mist with positive or negative static electricity. The gaseous TEOS is changed into the mist by, for example, utilizing a ultrasonic oscillator, utilizing a pressure difference or utilizing a Venturi atomizer. The mist is charged with static electricity by, for example, adhering electrons irradiated through gas discharge such as corona discharge to the mist, so as to charge the mist with negative static electricity.

Furthermore, the mist size filter 316 allows TEOS mist particles with a size smaller than a predetermined size, for example, of 0.01 $\mu$m through several $\mu$m alone to pass therethrough. The mist size filter 316 can be, for example, any of the following: Mechanical means such as meshes is disposed as the filter; a transport pipe for transporting the mist is disposed in a zigzag manner so as to utilize the speed of the mist, specifically, so as to eliminate mist particles with a large size by utilizing the principle that mist particles with a large size tend to collide with the wall of a bent portion of the transport pipe due to their large kinetic energy; and charge of the mist is utilized, specifically, an electric field is applied to a transport pipe for transporting the mist so as to eliminate mist particles with a large size by utilizing the principle that mist particles with a large size tend to collide with the wall of the transport pipe due to their large electric energy.

An ozonizer 320 for generating ozone is provided outside the chamber 300, so that an oxygen gas supplied from an oxygen supply pipe 321 can be changed by the ozonizer 320 into an oxygen gas including ozone (which gas is herein designated simply as ozone) One end of an ozone supply pipe 323 provided with a flow adjusting valve 322 extends to the inside of the ozonizer 320, and the generated ozone is sent toward the other end of the ozone supply pipe 323 with its flow rate adjusted.

The end of the TEOS supply pipe 314 farther from the TEOS heat insulator 310 and the end of the ozone supply pipe 323 farther from the ozonizer 320 are confluent to be connected to one end of a TEOS-$O_3$ supply pipe 330, so that the TEOS sent through the TEOS supply pipe 314 and the ozone sent through the ozone supply pipe 323 can be mixed to be sent toward the other end of the TEOS-$O_3$ supply pipe 330.

An HMDS heat insulator 340 is provided outside the chamber 300, and the HMDS heat insulator 340 contains an HMDS storage vessel 341 for storing an HMDS solution. One end of a nitrogen supply pipe 342 extends to the inside of the HMDS storage vessel 341, so as to bubble the HMDS solution with a nitrogen gas supplied through the nitrogen supply pipe 342. One end of an HMDS supply pipe 344 provided with a flow adjusting valve 343 extends to a portion above the HMDS storage vessel 341, so that HMDS changed into a gas by bubbling is sent toward the other end of the HMDS supply pipe 344 with its flow rate adjusted.

The end of the TEOS-$O_3$ supply pipe 330 farther from the confluence and the end of the HMDS supply pipe 344 farther from the HDMS heat insulator 340 are connected to one end of a material supply pipe 351 through a three-way valve 350 for mixing the TEOS-$O_3$ and the HMDS, so that the TEOS-$O_3$ and the HMDS can be singly or together supplied to the inside of the chamber 300 through the material supply pipe 351 to be supplied onto the surface of the semiconductor substrate 301 through a material supplier 352.

As described so far, in a semiconductor device or a method for fabricating the semiconductor device of this invention, since a first TEOS-$O_3$ film has high quality because it is free from defects such as holes and has a large water content, the adhesion to a protection film can be improved. Also, since a second TEOS-$O_3$ film has a small water content, it applies large stress to a capacitor dielectric film of a capacitor, and hence, the spontaneous polarization characteristic of the capacitor dielectric film can be improved. As a result, a semiconductor device including a highly reliable capacitor can be fabricated.

Alternatively, in a semiconductor device or a method for fabricating the semiconductor device of this invention, since a TEOS-$O_3$ film is formed on an underlying oxide film having no dependency on an underlying film and having good conformability to the TEOS-$O_3$ film, it can be satisfactorily grown without being affected by underlying films. Accordingly, an interlayer insulating film can be formed in a uniform thickness. As a result, a semiconductor device including a stable and long-lived capacitor can be fabricated.

Furthermore, in a system for fabricating a semiconductor device of this invention, a hydrophobic primer layer can be formed on an underlying film such as a protection film or an underlying oxide film formed below a TEOS-$O_3$ film. Accordingly, a TEOS-$O_3$ film with good step coverage can be grown.

What is claimed is:

1. A semiconductor device comprising:
   a capacitor including a capacitor lower electrode, a capacitor dielectric film of a highly dielectric film or a ferroelectric film and a capacitor upper electrode successively formed on a semiconductor substrate;
   a protection film formed on said semiconductor substrate over said capacitor;
   a first TEOS-$O_3$ film formed on said protection film through first TEOS-$O_3$ CVD; and
   a second TEOS-$O_3$ film formed on said first TEOS-$O_3$ film through second TEOS-$O_3$ CVD wherein said second TEOS-$O_3$ film has a higher ozone concentration and a lower water content as compared to said first TEOS-$O_3$ film.

2. The semiconductor device of claim 1, further comprising a hydrophobic primer layer formed on a surface of said protection film.

3. The semiconductor device of claim 1, further comprising an underlying oxide film formed, between said protection film and said first TEOS-$O_3$ film, from a silicon oxide film including no impurity or a silicon oxide film including at least one of boron and phosphorus.

4. The semiconductor device of claim 3, further comprising a hydrophobic primer layer formed on a surface of said underlying oxide film.

* * * * *